(12) United States Patent
Proudfoot

(10) Patent No.: US 6,346,768 B1
(45) Date of Patent: Feb. 12, 2002

(54) LOW ENERGY ION GUN HAVING MULTIPLE MULTI-APERTURE ELECTRODE GRIDS WITH SPECIFIC SPACING REQUIREMENTS

(75) Inventor: Gary Proudfoot, Wantage (GB)

(73) Assignee: Nordiko Limited (GB)

( * ) Notice: Subject to any disclaimer, the term of this patent is extended or adjusted under 35 U.S.C. 154(b) by 0 days.

(21) Appl. No.: 09/284,929

(22) PCT Filed: Oct. 23, 1997

(86) PCT No.: PCT/GB97/02923

§ 371 Date: Jun. 7, 1999

§ 102(e) Date: Jun. 7, 1999

(87) PCT Pub. No.: WO98/18150

PCT Pub. Date: Apr. 30, 1998

(30) Foreign Application Priority Data

Oct. 24, 1996 (GB) ............................................. 9622127

(51) Int. Cl.[7] .............................. H05B 31/26; H01J 7/24; H01J 27/00
(52) U.S. Cl. .................. 313/359.1; 313/230; 313/360.1; 313/361.1; 313/362.1; 313/363.1; 315/111.81; 315/111.41
(58) Field of Search ................................. 315/500–507, 315/111.21, 111.31, 111.41, 111.61, 111.81; 313/62, 359.1, 360.1, 362.1, 363.1; 250/423 R

(56) References Cited

U.S. PATENT DOCUMENTS 4,447,773 A    5/1984  Aston ........................ 328/233

FOREIGN PATENT DOCUMENTS

| EP | 0 095 366 | 11/1983 | ............ H01J/37/08 |
| EP | 0 462 165 B1 | 3/1990 | ............ H01J/27/16 |
| JP | 55 122342 | 9/1980 | ............ H01J/27/02 |
| WO | WO 88/07259 | 9/1988 | ............ H01J/27/18 |
| WO | WO 90/10945 | 9/1990 | ............ H01J/27/16 |

OTHER PUBLICATIONS

H. Gray et al., UK Ion Propulsion System Development, Journal of the British Interplanetary Society, vol. 49, No. 5, May 1, 1996, pp. 162–172.

Primary Examiner—Vip Patel
Assistant Examiner—Mack Haynes
(74) Attorney, Agent, or Firm—Senniger, Powers, Leavitt & Roedel

(57) ABSTRACT

A low energy ion gun for ion beam processing. The ion gun includes a plasma chamber having an open ended, conductive, non-magnetic body, a first end of which is closed by a flat or minimally dished dielectric member and with electrodes at a second end thereof opposite the first end. The ion gun also has primary magnets arranged around the body for trapping electrons adjacent the wall of the plasma chamber in use of the ion gun and an r.f. induction device. The electrodes include multi-aperture grids arranged for connection to respective positive potential sources and positioned to contact the plasma in the plasma chamber. The apertures of the grids are aligned so that particles emerging from an aperture of a first one of the grids are accelerated through corresponding apertures of the other grids in the form of a beamlet. A plurality of beamlets forms a beam.

29 Claims, 21 Drawing Sheets

LOW ENERGY ION GUN HAVING MULTIPLE MULTI-APERTURE ELECTRODE GRIDS WITH SPECIFIC SPACING REQUIREMENTS

BACKGROUND OF THE INVENTION

This invention relates to an apparatus for generating a beam of charged particles, particularly to an ion gun for use in an ion beam processing apparatus and to an ion beam processing apparatus incorporating same.

Ion beams have been used for many years in the production of components in the micro-electronics industry and magnetic thin film devices in the storage media industry. Typically, an ion beam, such as an argon ion beam, is required to have a large area, a high current and an energy of between 100 eV and 2 keV. The beam can be used in a number of ways to modify the surface of a substrate, for example by sputter deposition, sputter etching, milling, or implantation.

In a typical ion beam source (or ion gun) a plasma is produced by admitting a gas or vapour to a low pressure discharge chamber containing a heated cathode and an anode which serves to remove electrons from the plasma and to give a surplus of positively charged ions which pass through a screen grid or grids into a target chamber which is pumped to a lower pressure than the discharge chamber. Ions are formed in the discharge chamber by electron impact ionisation and move within the body of the ion gun by random thermal motion. The plasma will thus exhibit positive plasma potential which is higher than the potential of any surface with which it comes into contact. Various arrangements of grids can be used, the potentials of which are individually controlled. In a multigrid system the first grid encountered by the ions is usually positively biased whilst the second grid is negatively biased. A further grid may be used to decelerate the ions emerging from the ion source so as to provide a collimated beam of ions having more or less uniform energy. For ion sputtering a target is placed in the target chamber where this can be struck by the beam of ions, usually at an oblique angle, and the substrate on to which material is to be sputtered is placed in a position where sputtered material can impinge on it. When sputter etching, milling or implantation is to be practised the substrate is placed in the path of the ion beam.

Hence, in a typical ion gun an ion arriving at a multiaperture extraction grid assembly first meets a positively biased grid. Associated with the grid is a plasma sheath. Across this sheath is dropped the potential difference between the plasma and the grid. This accelerating potential will attract ions in the sheath region to the first grid. Any ion moving through an aperture in this first grid, and entering the space between the first, positively biased grid, and the second, negatively biased, grid is strongly accelerated in an intense electrical field. As the ion passes through the aperture in the second grid and is in flight to the earthed target it is moving through a decelerating field. The ion then arrives at an earthed target with an energy equal to the potential of the first, positive, grid plus the sheath potential.

Hence, a conventional ion gun comprises a source of charged particles which are accelerated through an externally applied electric field created between a pair of grids. Conventionally, for low energy ion beam production, three grids are used, the first being held at a positive potential, the second being held at a negative potential adjusted to give the best divergence, and the third, if present, at earth potential, i.e. the potential of the chamber in which the beam is produced. Beams of this nature are well described in the open literature going back over 25 years.

In some applications it is desirable to obtain an ion beam of maximum current. However, in other applications it is the divergence of the ions comprising the beam, or rather the relative lack of it, that is critical to achieving a suitable process performance.

U.S. Pat. No. 4,447,773 discloses an ion beam accelerator system for extracting and accelerating ions from a source. The system includes a pair of spaced, parallel extraction grids, 60 mil (1.524 mm) apart, having aligned pairs of holes for extracting ion beamlets. The pairs of holes are positioned so that the beamlets converge and the merged beamlets are accelerated by an accelerator electrode which is 0.6 inch (15.24 mm) downstream of the extraction grid pair. The extraction grids are formed with numerous small holes through which beamlets of ions can pass and are maintained a potential difference of a few hundred volts. The accelerator electrode has a single hole, which is slightly greater in height than the height of the matrix of holes in the extraction grids, and is maintained at a much lower potential for accelerating the converged ion beam emerging from the extraction grid pair.

An extensive introduction to and prior art review of ion beam technology is provided in EP-B-0462165. EP-B-0462165 itself describes an ion gun in which the plasma from which the ions are accelerated by the accelerator grid is at a low potential of not more than about 500 V and is of uniform density so as to permit high current densities of the order 2 to 5 mA/cm$^2$ in the ion beam to be achieved at low potential (i.e. less than about 500 V), and with minimum risk of damage to the accelerator grid, in operation. This system provides an ion gun in which the plasma can be efficiently generated using a commercially acceptable high radio frequency, such as 13.56 MHz or a multiple thereof, and in which the resulting plasma has the desirable properties of high density, good uniformity and a relatively low plasma potential.

However, a perennial problem with the ion beam sources described in the prior art is the high magnitude of divergence to which the beam is susceptible. Whilst the system of EP-B-0462165 solves many of the problems associated with other prior art ion beam sources, it would still be highly desirable to improve this system to provide a reduced degree of ion beam divergence. There is a growing demand for ultra low divergence at low to medium beam energy. In this role the beam is typically described as an ion mill selectively etching deep trenches of perhaps 1×10 $\mu$m scale length. To do so requires a beam with a divergence of no more than approximately 1° at an energy dictated by the constraints of maximum rate at a processing energy of perhaps as low as 500 eV. Conventional ion guns operating at this energy cannot meet the divergence requirement at a high enough current to meet the process rate.

SUMMARY OF THE INVENTION

The present invention accordingly seeks to provide an ion gun which is capable of operation in a manner such that the above aims are substantially achieved.

According to the present invention there is provided apparatus for the production of low energy charged particle beams comprising: a plasma chamber; means for generating in the plasma chamber a plasma comprising particles of a first polarity and oppositely charged particles of a second polarity; means for restraining particles of the first polarity in the plasma chamber; a first multi-aperture electrode grid contacting the plasma, wherein the first electrode grid is arranged for connection to a first potential source so as to impart to the first electrode grid a first potential of the second polarity; a second multi-aperture electrode grid arranged for connection to a second potential source so as to impart to the second electrode grid a second potential, the second potential being less than in the sense of being either less positive than or less negative than the first potential so as to produce between the first and second electrode grids a first acceleration field for accelerating charged particles of the second polarity towards and through the second grid; and a third multi-aperture electrode grid arranged for connection to a third potential source so as to impart to the third electrode grid a third potential of the first polarity and to produce between the second and third electrode grids a second acceleration field for accelerating charged particles of the second polarity towards and through the third electrode grid, the grid spacing between the first and second grids being greater at the periphery of the grids than at the centre thereof, the apertures of the first, second and third grids being aligned so that particles emerging from an aperture of the first grid are accelerated through a corresponding aperture of the second grid and then through a corresponding aperture of the third grid in the form of a beamlet, a plurality of beamlets from the third grid forming a beam downstream of the third grid.

The apparatus of the invention may be used to generate an electron beam. in which case the charged particles of the first polarity are ions and the charged particles of the second polarity are electrons, or to generate an ion beam, in which case the charged particles of the first polarity are electrons and the charged particles of the second polarity are ions.

Accordingly, the invention provides a low energy ion gun for use in ion beam processing comprising: a plasma chamber comprising an open ended, conductive, non-magnetic body, a first end of which is closed by a flat or minimally dished dielectric member and with electrodes at a second end thereof opposite the first end; primary magnet means arranged around the body for trapping electrons adjacent the wall of the plasma chamber in use of the ion gun; and an r.f. induction device including a substantially flat coil which lies adjacent to the dielectric member for inductively generating a plasma in the plasma chamber, characterised in that the electrodes include a first multi-aperture grid arranged for connection to a first positive potential source and positioned to contact the plasma in the plasma chamber; a second multi-aperture grid arranged for connection to a second potential source of lower potential than the first source so as to produce a first acceleration field for accelerating ions towards and through the second grid; and a third multi-aperture grid arranged for connection to a third potential source of lower potential than the second potential source so as to produce a second acceleration field for accelerating ions towards and through the third grid, the grid spacing between the first and second grids being greater at the periphery of the grids than at the centre thereof, the apertures of the first, second and third grids being aligned so that particles emerging from an aperture of the first grid are accelerated through a corresponding aperture of the second grid and then through a corresponding aperture of the third grid in the form of a beamlet, a plurality of beamlets from the third grid forming a beam downstream of the third grid.

The provision of a grid spacing between the first and second grids which is greater at the periphery of the grids than at the centre thereof is an important feature of these embodiments of the invention. Preferably this variation in grid spacing is achieved by contouring one or both of the neighbouring surfaces of the first and second grids. Thus, in one preferred embodiment, the second grid has a generally flat surface towards its periphery but in its central region bulges outwardly towards the first grid. The provision of this variation in grid spacing over the grids recognises that the plasma density of the beam approaching the first grid tends to diminish towards the periphery of the beam. The acceleration field to which individual beamlets are subject on passing through the first grid depends to some extent upon the grid spacing, which may therefore be selected to optimise the divergence of individual beamlets, whether from the periphery or the central region of the first grid.

In one embodiment of the invention, the third potential source may be arranged to impart a negative potential to the third grid. Alternatively, the third potential source may be arranged to earth the third grid. In this case, a fourth grid may be provided and arranged for connection to earth.

The invention further provides a low energy ion gun for use in ion beam processing comprising: a plasma chamber comprising an open ended, conductive, non-magnetic body, a first end of which is closed by a flat or minimally dished dielectric member and with electrodes at a second end thereof opposite the first end; primary magnet means arranged around the body for trapping electrons adjacent the wall of the plasma chamber in use of the ion gun; and an r.f. induction device including a substantially flat coil which lies adjacent to the dielectric member for inductively generating a plasma in the plasma chamber, characterised in that the electrodes include a first multi-aperture grid arranged for a connection to a first positive potential source and positioned to contact the plasma in the plasma chamber; a second multi-aperture grid arranged for connection to a second potential source of lower potential than the first source so as to produce a first acceleration field for accelerating ions towards and through the second grid; a third multi-aperture grid arranged for connection to a negative potential source so as to produce a second acceleration field for accelerating ions towards and through the third grid; and a fourth multi-aperture grid arranged for connection to earth, the apertures of the first, second, third and fourth grids being aligned so that ions emerging from an aperture of the first grid are accelerated through a corresponding aperture of the second grid and then through a corresponding aperture of the third grid before passing through a corresponding aperture of the fourth grid in the form of a beamlet, a plurality of beamlets from the fourth grid forming a beam downstream of the fourth grid.

Also provided in accordance with the invention is a low energy electron gun for use in electron beam processing comprising: a plasma chamber comprising an open ended, conductive, non-magnetic body, a first end of which is closed by a flat or minimally dished dielectric member and with electrodes at a second end thereof opposite the first end; primary magnet means arranged around the body for trapping ions adjacent the wall of the plasma chamber in use of the electron ion gun; and an r.f. induction device including a substantially flat coil which lies adjacent to the dielectric member for inductively generating a plasma in the plasma chamber, characterised in that the electrodes include a first multi-aperture grid arranged for connection to a first negative potential source and positioned to contact the plasma in the plasma chamber; a second multi-aperture grid arranged for connection to a second negative potential source of less negative potential than the first source so as to produce a first acceleration field for accelerating electrons towards and through the second grid; and a third multiaperture grid arranged for connection to a third potential source of higher potential than the second potential source so as to produce a second acceleration field for accelerating electrons towards and through the third grid, the apertures of the first, second and third grids being aligned so that electrons emerging from an aperture of the first grid are accelerated through a corresponding aperture of the second grid and then through a corresponding aperture of the third grid in the form of a beamlets, a plurality of beamlets from the third grid forming a beam downstream of the third grid.

The invention also provides a method for generating a low energy ion beam, which method comprises;

(a) providing an ion gun according to the foregoing description;

(b) supplying to the plasma chamber a plasma forming gas;

(c) exciting the R.f. induction device to generate a plasma within the plasma chamber;

(d) supplying the plasma to an inlet end of the first grid so that the plasma passes through the first grid towards an outlet end thereof;

(e) accelerating the plasma between the outlet end of the first grid and an inlet end of the second grid so that the plasma passes through the second grid towards an outlet end thereof;

(f) further accelerating the plasma between the outlet end of the second positive grid and an inlet end of the third grid so that the plasma passes through the third grid towards an outlet end thereof; and (g) recovering an ion beam from the outlet end of the third grid.

The invention further provides a low energy ion beam processing apparatus comprising (1) a vacuum chamber;

(2) an ion gun arranged to project an ion beam into the vacuum chamber;

(3) an ion beam neutraliser for projecting electrons into the ion beam; and (4) a support for a target or a substrate in the path of the ion beam; the ion gun comprising:

a plasma chamber comprising an open ended, conductive, non-magnetic body, a first end of which is closed by a flat or minimally dished dielectric member and with electrodes at a second end thereof opposite the first end;

primary magnet means arranged around the body for trapping electrons adjacent the wall of the plasma chamber in use of the ion gun; and an r.f. induction device including a substantially flat coil which lies adjacent to the dielectric member for inductively generating a plasma in the plasma chamber, characterised in that the electrodes include a first multi-aperture grid arranged for connection to a first positive potential source and positioned to contact the plasma in the plasma chamber;

a second multi-aperture grid arranged for connection to a second potential source of lower potential than the first source so as to produce a first acceleration field for accelerating ions towards and through the second grid; and a third multi-aperture grid arranged for connection to earth or to a negative potential source so as to produce a second acceleration field for accelerating ions towards and through the third grid, the apertures of the first, second and third grids being aligned so that particles emerging from an aperture of the first grid are accelerated through a corresponding aperture of the second grid and then through a corresponding aperture of the third grid in the form of a beamlet, a plurality of beamlets from the third grid forming a beam downstream of the third grid.

By "low energy" is meant up to about 10 kV, for example 5 kV or less. Usually, the ion beam generated by the apparatus of the invention will have an energy of 1 kV or less.

The ion gun of the invention is capable of generating an ion beam of significantly lower divergence than has conventionally been achievable. A 500 eV ion beam generated by a gun according to the invention may have a divergence of as little as 1°. This compares directly with values of between 3° and 5° for prior art ion beams utilising conventional three grid electrode grid structures. It has surprisingly been discovered that an underlying design rule for ultra-low divergence ion beams has not been recognised in the prior art. The basis of the prior art, as exemplified by EP-B-0462165, lies in the electrostatic lens principle underpinning the simple two/three grid conventional accelerator structures and its balance with the natural space charge repulsive force in the beam. This repulsive force leads to an irreducible divergence limit for such structures. The ion beams of the prior art are vigorously compressed by a strong accelerating force provided by a first, positively charged grid and a second, negatively charged grid. The potential difference between the first and second grids may be of the order of 1000 V. As the beam passes through the second grid, the space charge force reaches a maximum and acts upon the beam to cause it to diverge as it propagates beyond the second grid. The space charge force increases with increasing beam current, with reducing beam radius and with reducing beam energy. Empirically it has been found that the lower limit of divergence for a 500 eV beam for a three grid accelerator with a beam current viable for industrial processing lies between 3° and 5°. In contrast, the ion gun of the present invention is capable of yielding a divergence value of 1°.

One preferred way in which the angular divergence of the beam may be minimised in the present invention is by adopting a more gentle acceleration field between the first and second grids than between the second and third grids. This allows the beamlets to propagate at a larger net area, hence reducing the space charge repulsion inside the accelerator grid structure itself.

The ion gun of the invention may of course be provided with more than three grids. For example, three, four or more positive biassed grids, each of successively lower positive bias than its upstream neighbour, could be used. Alternatively, or in addition, a plurality of negatively biassed or earthed grids could be incorporated towards the downstream end of the grid structure. However, for most applications, it is envisaged that a three or four grid structure will be preferred. In the three grid structure, the first and second grids may be positively biassed, the first grid being in contact with the plasma in the plasma chamber, the second grid being of lower positive bias than the first grid, and the third grid may be negatively biassed or earthed. In the four grid structure the first and second grids may be positively biassed, as described above, while the third grid may be negatively biassed and the fourth grid is earthed or negatively biassed. Thus, in one preferred embodiment of the invention, the third grid of the electrodes is arranged for connection to a negative potential source and the electrodes include a fourth grid arranged for connection to earth. The fourth grid may be used to provide an extra degree of control over the rates of acceleration and divergence of the ion beam.

Preferably, the grid arrangement is rigid since the mechanical separation of the grids plays a large part in determining the divergence of the beam. For example, a variation of 10% or more in the distance between two grids can have a significant impact on the net divergence of a large area beam. Furtherrnore, the relationship between beam divergence and the magnitude of the gap between the grids is substantially non-linear.

However, beam divergence is also a function of the local ion current density in the beam. As the cross-sectional area of the beam increases, the current density in the beam cross-section may vary by up to about 10%. The current density is lower towards the periphery of the beam.

In one embodiment of the invention, the grids are arranged in parallel alignment with each other. The gap between neighbouring grids is preferably between about 0.5 mm and about 3.0 mm, typically about 1.00 mm.

In a preferred embodiment, however, one grid of a neighbouring pair of grids is contoured so that the gap between the two grids of the pair is larger towards the periphery of the grids than towards the centre of the grids. For example, the gap at the centre of the pair may be about 1.00 mm while the gap at the periphery is about 1.3 mm. Preferably, the second grid is contoured.

The variation in current density across the beam is usually constant and repeatable and this may be exploited to obtain best average divergence across a large beam. Numerical simulation may be used to confirm this variation with respect to the magnitude of the in gap between neighbouring grids and the current density in the beam.

In one preferred embodiment of the invention, four grids are provided, the gap between each grid, at the centre thereof, being about 1.00 mm. Preferably, one or more of the grids is contoured as described above. Even more preferably, only the second grid is contoured.

The ion gun of the invention is of particular value for generating low energy beams of heavy ions, such as argon, which are commonly used in ion milling applications. Since the space charge force increases in inverse proportion to the ion velocity, the effect on the divergence of an argon ion beam at 500 eV is over 50 times larger than for a hydrogen ion beam at 50 KeV for a comparable beam current. Other heavy ions commonly used in ion milling applications include ions derived from krypton, xenon, $H_2$, $O_2$, $Cl_2$, $N_2$, $CO_2$, $SF_6$, $C_2F_6$ or a $C_2F_6/CHF_3$ mixture.

In the ion gun of the present invention inductive r.f. coupling is used to generate a plasma in the plasma chamber. The resulting plasma typically exhibits a plasma potential that is no more than a few tens of volts above the potential of the plasma chamber or of the highest potential of the internal surface thereof. This is in contrast to many of the prior art designs of ion gun which utilise capacitative r.f. coupling to generate the plasma and which form a plasma with a plasma potential of some hundreds of volts.

The wall means may be constructed from an electrically conductive material. However, if it is desired, for example, to avoid any possibility of contamination of the ion beam by metallic ion contaminants, then the wall means may be constructed from a dielectric material.

The primary magnet means may comprise an array of magnets arranged to produce lines of magnetic flux within the plasma chamber which extend in a curve from the wall of the plasma chamber and return thereto so as to form an arch over a respective one of a plurality of wall regions of said plasma chamber, for example, wall regions which extend substantially longitudinally of the wall of the plasma chamber. Rare earth magnets are preferably used. Specific arrangements of the primary magnet means are described in EP-B-0462165 and are well understood by those skilled in the art.

It is preferred to use as near flat dielectric member as possible. Hence minimal dishing of the dielectric member is preferred. However, it may not be practical to avoid all dishing of the dielectric member as it must be ensured that the integrity of the vacuum equipment be preserved and that all risk of fracture of the dielectric member due to pressure differences exerted across it during operation is substantially obviated.

The r.f. emitter means associated with the dielectric member comprises a substantially flat spirally wound coil which preferably lies adjacent to, or is embedded within, the dielectric member. Hence the coil is preferably flat or as near flat as practicable. Such a coil may take the form of a tube of conductive material e.g. copper, through which a coolant, such as water, can be passed. This type of coil, and the advantages thereof, are also described in EP-B-0462165.

Typically the r.f. emitter means associated with the dielectric member is arranged to be connected to an r.f. power source which operates at a frequency in the range of from about 1 MHz up to about 45 MHz, e.g. at about 2 MHz or, more preferably, at one of the industrially allotted wavebands within this range of frequencies e.g. at 13.56 MHz or 27.12 MHz or 40.68 MHz.

By appropriate choice of geometry for the spiral driving coil and by modifying the magnetic field strength and/or distribution within the plasma chamber it is possible to tune the excitation of the discharge for a variety of gases, e.g. Ar, $O_2$ or $N_2$.

In a preferred form an ion gun according to the invention further includes secondary magnet means associated with the r.f. emitter means for producing a magnetic dipole field that penetrates the r.f. energising coil or other form of r.f. emitter means.

It is also possible to provide a further magnet means, hereinafter called a tertiary magnet means, for superimposing a longer range axial field on top of the field produced by the multipole array of said primary magnet means. Such a tertiary magnet means can, for example, take the form of an electromagnet surrounding the plasma chamber whose axis is arranged to be substantially aligned with or parallel to that of the plasma chamber.

In an ion beam apparatus according to the invention it is preferred to utilise an ion beam neutraliser that is powered by an r.f. energy source to produce a beam of electrons that can be projected into the ion beam. Conveniently, such an r.f. energy source operates at the same frequency as that of the r.f. generator means of the ion gun.

The invention thus may utilise an ion beam neutraliser comprising an open ended plasma source chamber, means for admitting a plasma forming gas to the plasma source chamber, an r.f. generating coil surrounding the plasma source chamber for generating a plasma therein, and an extraction grid structure across the open end of the plasma source chamber including a first grid arranged for connection to a negative potential source and a second grid arranged for connection to a positive potential source so as to produce a first acceleration field for accelerating electrons towards and through the second grid of the extraction grid structure. Such an ion beam neutraliser may use an inert gas, a reactive gas or a mixture of an inert gas and a reactive gas, as plasma forming gas.

BRIEF DESCRIPTION OF THE DRAWINGS

In order that the invention may be clearly understood and readily carried into effect, some preferred forms of ion beam processing apparatus will now be described, by way of example only, with reference to the accompanying semi-diagrammatic drawings, in which.

DETAILED DESCRIPTION OF THE INVENTION

Figure 1:
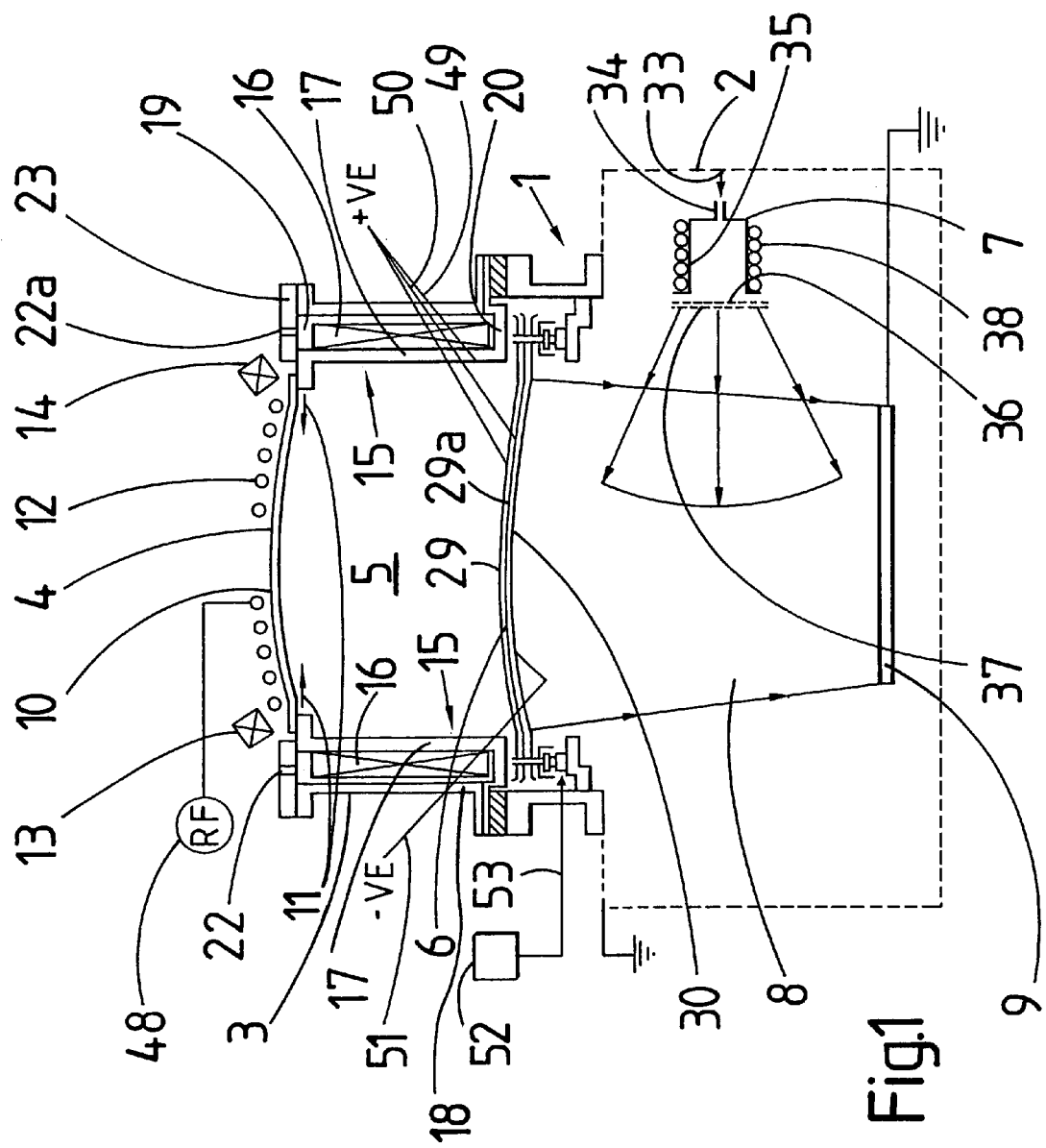
FIG. 1 is a vertical section through an ion beam processing apparatus.

Referring to FIGS. 1 to 7 of the drawings, an ion beam processing apparatus 1 comprises a vacuum chamber (indicated diagrammatically at 2) surmounted by an ion gun 3. Ion gun 3 comprises a plasma generator 4 mounted on top of an open ended plasma chamber 5, the lower end of which is closed by a control grid structure 6. Control grid structure 6 is described in detail below. A plasma neutraliser 7 is mounted within vacuum chamber 2 for neutralising the ion beam 8 which issues from the lower end of ion gun 3. A target 9 is placed in the path of the ion beam 8.

Plasma generator 4 comprises a dielectric member 10 which closes the top open end of plasma chamber 5. A number of gas inlet nozzles are provided, as indicated by arrows 11, through which a plasma forming gas, such as argon, or a mixture of a plasma forming gas and a reactive gas, such as oxygen, can be admitted to the plasma chamber 5. An r.f. coil 12 surmounts member 10 and is connected to a suitable r.f. power source operating at, for example 13.56 MHz. Magnets 13 and 14 are provided for a purpose which will be further described below.

Plasma chamber 5 comprises an open-ended metallic body 15, made of aluminium or of an aluminium alloy or another conductive non-magnetic material, within which are mounted a plurality of primary bar magnets 16. For ease of assembly body 15 is made in two parts, i.e. an inner part 17 and an outer part 18, between which the primary magnets 16 are positioned.

Figure 3:
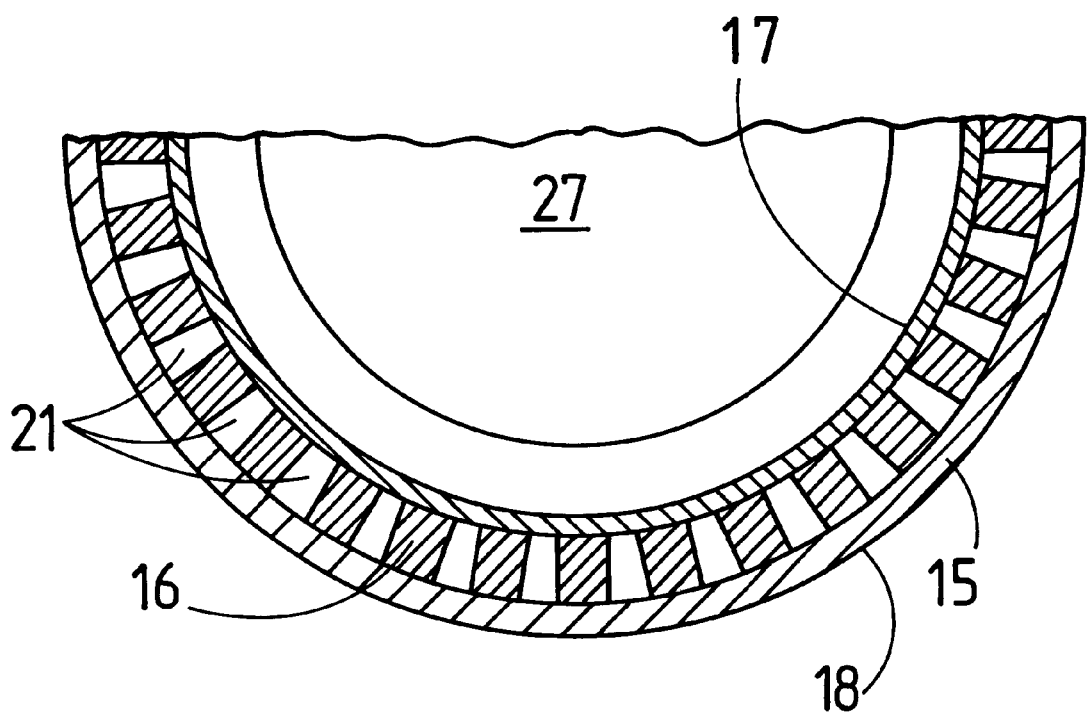
FIG. 3 is a partial horizontal section through the plasma chamber of the apparatus of FIGS. 1 and 2.

As can be seen from FIG. 3, there are thirty-two primary bar magnets 16 secured longitudinally to the cylindrical outer face of inner part 17. Preferably the strongest available magnets, e.g. rare earth magnets such as samarium-cobalt magnets, are used. Typically such magnets exhibit a field strength of the order of 1 to 2 kGauss. As illustrated in FIG. 3 there are thirty-two primary magnets 16. However, a larger or smaller number of primary magnets, for example thirty or less (e.g. twenty-four) or up to forty or more (e.g. forty-eight), may be used, provided always that there is an even number of primary magnets 16. Such primary magnets 16 are evenly spaced around the outer periphery of inner part 17 with their longest dimension arranged substantially parallel to the axis of the plasma chamber 5. As indicated in FIG. 4, however, the magnetic axes of primary magnets 16 are arranged radially with respect to plasma chamber 5 so that their respective north and south poles (indicated as N and S respectively in FIG. 4) are separated in the direction of their shortest dimension, the primary magnets 16 being arranged with alternating magnetic polarity around the periphery of inner part 17.

Figure 5:
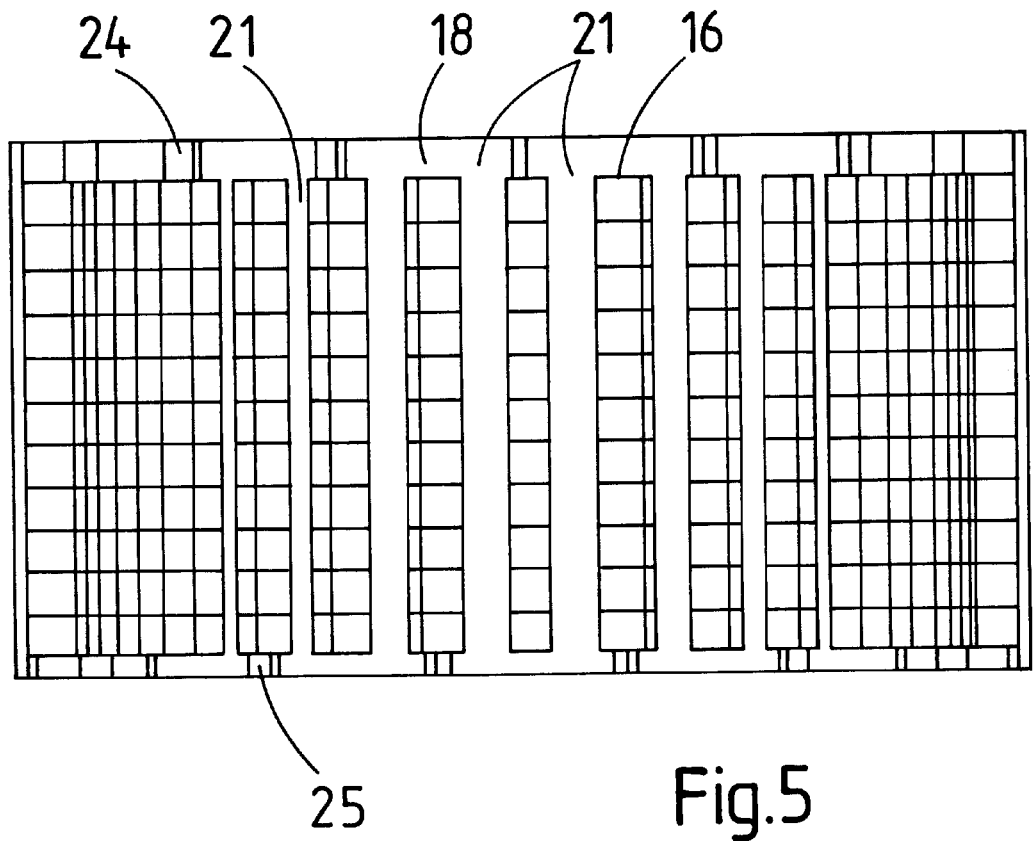
FIG. 5 is a view of the primary magnet array of the apparatus of FIGS. 1 to 4.

Above primary magnets 16 is an annular groove 19 and below them a corresponding annular groove 20. Grooves 19 and 20 communicate one with another via spaces 21 between adjacent primary magnets 16. The grooves 19 and and spaces 21 form channels for coolant fluid (e.g. water) by means of which the primary magnets 16 and body 15 can be cooled in use. Reference numerals 22 and 22a indicate coolant fluid supply and withdrawal conduits provided in annular member 23. Baffles 24, 25 are provided in grooves 19, 20, as can be seen in FIG. 5, in order to make the coolant fluid follow a predetermined path.

Figure 4:
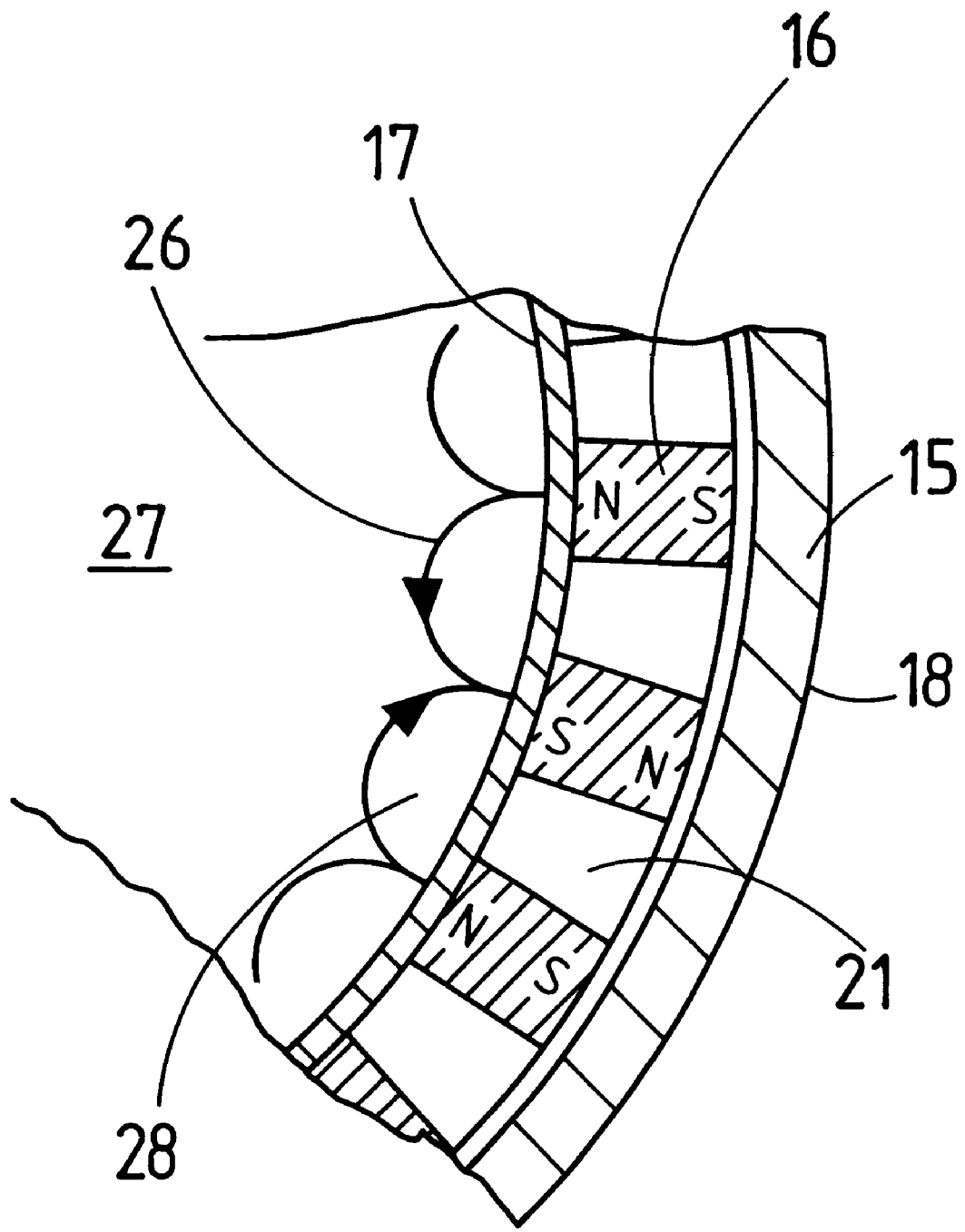
FIG. 4 is an enlarged view of part of FIG. 3.

FIG. 4 indicates the lines of magnetic force 26 produced by primary magnets 16. These lines of force extend from the inner surface of body 15 into cavity 27 in plasma chamber 5 and back into the wall of cavity 27 in an arch over regions 28 which extend parallel to the axis of body 5.

Figure 6:
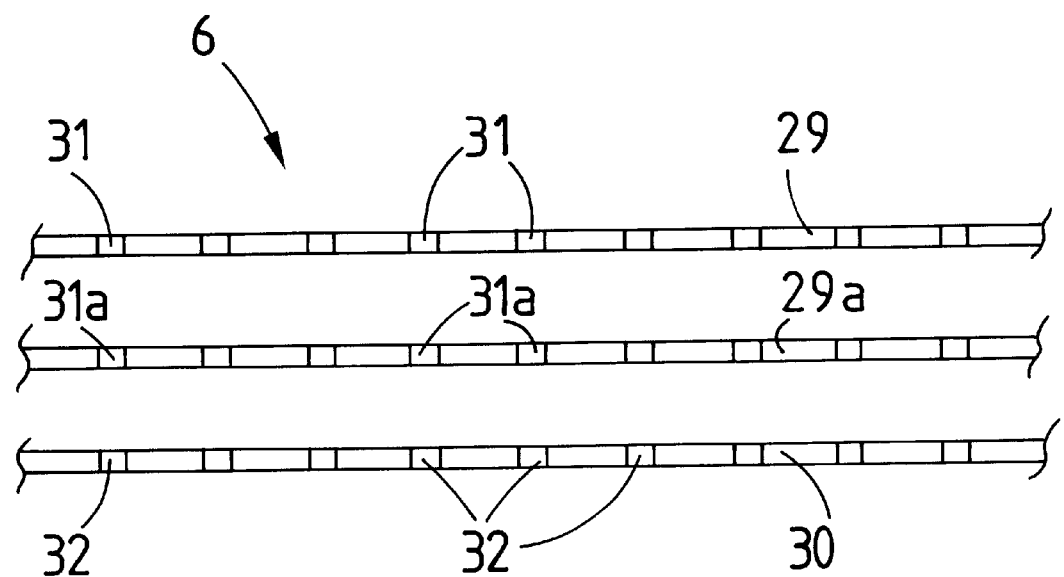
FIG. 6 is a vertical section on an enlarged scale through the control grid structure of the apparatus of FIGS. 1 to 5.
Figure 7:
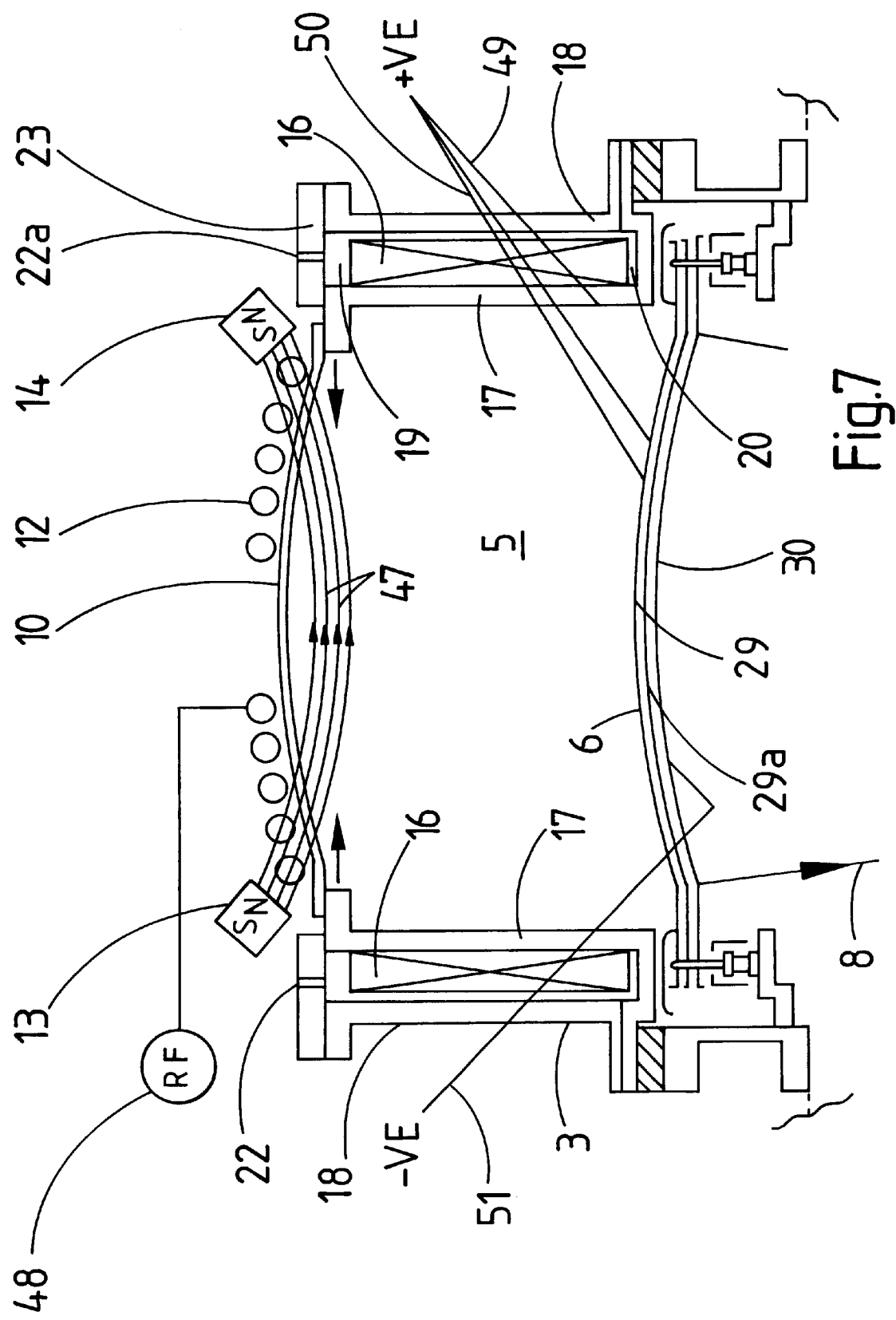
FIG. 7 illustrates the magnetic field produced by the secondary magnets of the ion gun shown in FIGS. 1 and 2.

Reverting to FIG. 1, the lower end of plasma chamber 5 is closed by a control grid structure 6 which is shown in more detail in FIG. 6 on a greatly enlarged scale. Grid structure 6 comprises three grids 29, 29a and 30, each formed with aligned holes 31, 31a and 32. Grid 29 is positively biased while grid is negatively biased or earthed. Grid 29a is positively biased, but more weakly so than grid 29 so as to set up two acceleration fields between grids 29 and 29a and grids 29a and 30 respectively to accelerate ions towards and through grids 29a and 30. Such grids can be manufactured from molybdenum or a molybdenum alloy or from carbon sheet or from a suitable aluminium alloy. Aluminium may offer specific benefits where heavy metal contamination is to be avoided. Typically grid 29 has a positive potential of up to about 1000 V applied to it, whilst a negative potential of from 0 to about 2000 V is applied to grid 30. Grid 29a has a positive potential of up to about 850 V or more, for example 750 applied to it. The ion beam generated through this grid arrangement is discussed more fully below.

Turning now to ion beam neutraliser 7, a gas, e.g. argon or oxygen, is supplied as indicated by arrow 33 through line 34 into a hollow insulated electrode assembly 35. The open end of electrode assembly 35 is closed by a pair of grids 36 and 37. An r.f. generator coil 38 surrounds electrode assembly 35. Conveniently this is driven at the same frequency as r.f. generator coil 12, e.g. 13.56 Mfz. Grid 36 is negatively biased, while grid 37 is positively biased so as to set up an acceleration field between grids 36 and 37 to accelerate electrons towards and through grid 37.

Figure 2:
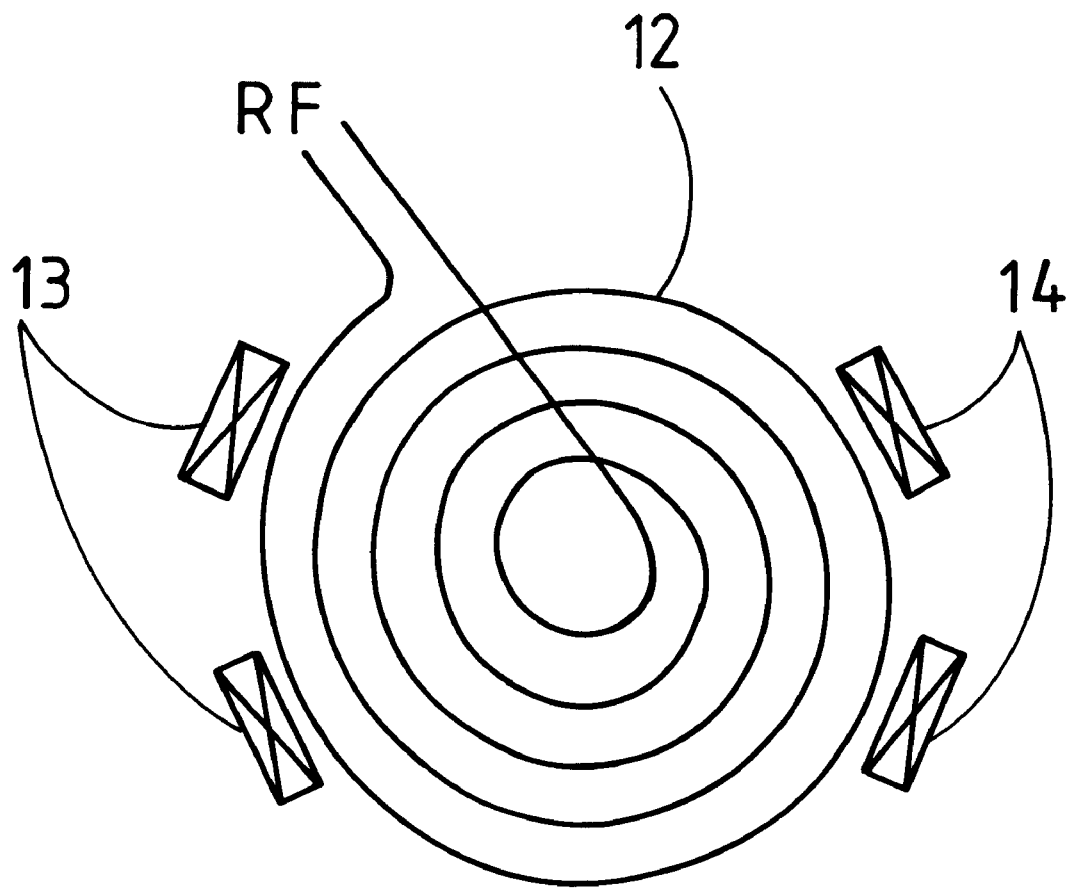
FIG. 2 is a plan view of the top of the ion gun of the apparatus of FIG. 1.

FIG. 2 illustrates in plan view the positions of the optional secondary magnets 13 and 14 relative to the r.f. generator coil 12. These secondary magnets produce a magnetic dipole field which penetrates the energizing coil 12. The shape of this magnetic field is shown diagrammatically in FIG. 7. As can be seen from FIG. 7 magnets 13 and 14 have their axes of magnetisation arranged so that either a north pole or a south pole faces the dielectric member 10 and so that the lines of force 47 penetrate the r.f. generator coil 12 and form an arch over the inner face of dielectric member 10.

Reference numeral 48 indicates an r.f. power source connected to coil 12; it can also be connected to coil 38. Alternatively coil 38 can have its own separate r.f. power source. Lines 49 and 50 indicate positive supply leads for electrode 17 and grid 29 respectively. Conveniently electrode 17 and grid 29 are at the same positive potential. Reference numeral 51 indicates a negative supply lead for providing the negative bias potential on grid 30.

Vacuum chamber 2 can be evacuated by means of a suitable vacuum pumping system 52 connected via line 53 to vacuum chamber 2.

In use of ion beam processing apparatus 1 vacuum chamber 2 is evacuated to a pressure of typically about $10^{-5}$ millibar to about $10^{-7}$ Pa ($1^{-7}$ millibar). A plasma forming gas, e.g. argon, a reactive gas, or a mixture of a plasma forming gas and a reactive gas, e.g. $O_2$, $CO_2$, $Cl_2$, $SF_6$, $C_2F_6$ or a $C_2F_6/CHF_3$ mixture is admitted via inlets 11. R.f. coil 12 is then excited to generate a plasma. This plasma has a plasma potential of at most a few tens of volts, for example about +10 V (volts) above the potential of the grid 29, which is normally at the same potential as the electrode 17. Electrons released are trapped within regions 28 by the magnetic lines of force 26. Grid 29 is biased to a positive potential of about 900 V, while grid 29a is biased to a positive potential of 725 V and grid 30 is biased to a negative potential of about –100 V. The ions in the cavity 28 are accelerated towards and pass through grid 29 and are then gently accelerated by the electric field between grid 29 and grid 29a before being further accelerated by the electric field between grid 29a and grid 30 to emerge in the form of a collimated ion beam 8 of defined energy. After passage through grid 30 ions in flight to the target 9, which is earthed, move in a decelerating field. The ions arrive at the earthed target 9 with an energy equal or approximately equal to the potential of the first, positive grid 29 plus the sheath potential. Thus, if a bias of +900 V is applied to grid 29, which is immersed in the plasma, then the ions will arrive at the target 9 with a potential of about 910 V, irrespective of how high a negative potential is applied to the third grid 30. Grid 29a is shaped to give a controlled variation of separation over the area of the grid. This enables changes in plasma density to be accommodated with minimal effect on the local beam divergence, as discussed below with reference to FIG. 23.

A plasma forming gas, such as argon, a reactive gas, or a mixture of a plasma forming gas and a reactive gas, is admitted to neutraliser 7 through tube 34 at a rate of from about 1 cm³ per minute to about 5 cm³ per minute, usually at the higher end of this range. The r.f. generator coil 38 is turned on to initiate electron discharge. Once electron discharge has started it can be maintained by use of a keeper potential of from about 20 V to about 40 V following reduction of the gas flow rate in tube 33 to about 1 cm³ per minute.

Under the influence of the r.f. signal from coil 12 the gas supplied via inlets 11 is dissociated to form a plasma of ions and free electrons in plasma chamber 5, the ions filling the central part of chamber 5 whilst the electrons are trapped adjacent the walls of chamber 5 by the magnetic lines of force 26. Because of the geometrical separation of the r.f. generating coil 12 from the zones 28 of the magnetic confinement region in plasma chamber 5 the plasma in the centre part of chamber 5 is subsequently uniform and has a relatively low plasma potential. This means in turn that a relatively low acceleration potential only is needed to extract ions from this plasma and to accelerate them towards and through control grid structure 6. Hence the risk of overheating of or damage to control grid structure 6, and particularly grid 29, is minimised.

Neutraliser 7 delivers a stream of electrons into the path of ion beam 8 and provides current neutralisation at the target 9.

As a heated cathode is not used to generate the plasma the illustrated apparatus can be used with any type of inert or reactive gas. Typical gases that can be used include argon, krypton, xenon, $H_2$, $O_2$, $Cl_2$, $SF_6$, $CO_2$, $CF_4$, $C_2F_6$, $CHF_3$ and mixtures of two or more thereof.

As illustrated the ion beam processing apparatus 1 is set up for ion beam milling. It is a simple matter to modify the apparatus for sputter deposition; in this case a target replaces substrate 9 and is arranged so that it is struck by ion beam 8 at an oblique angle, while a target is placed in the path of the ensuing sputtered material but out of the path of the ion beam.

Figure 8:
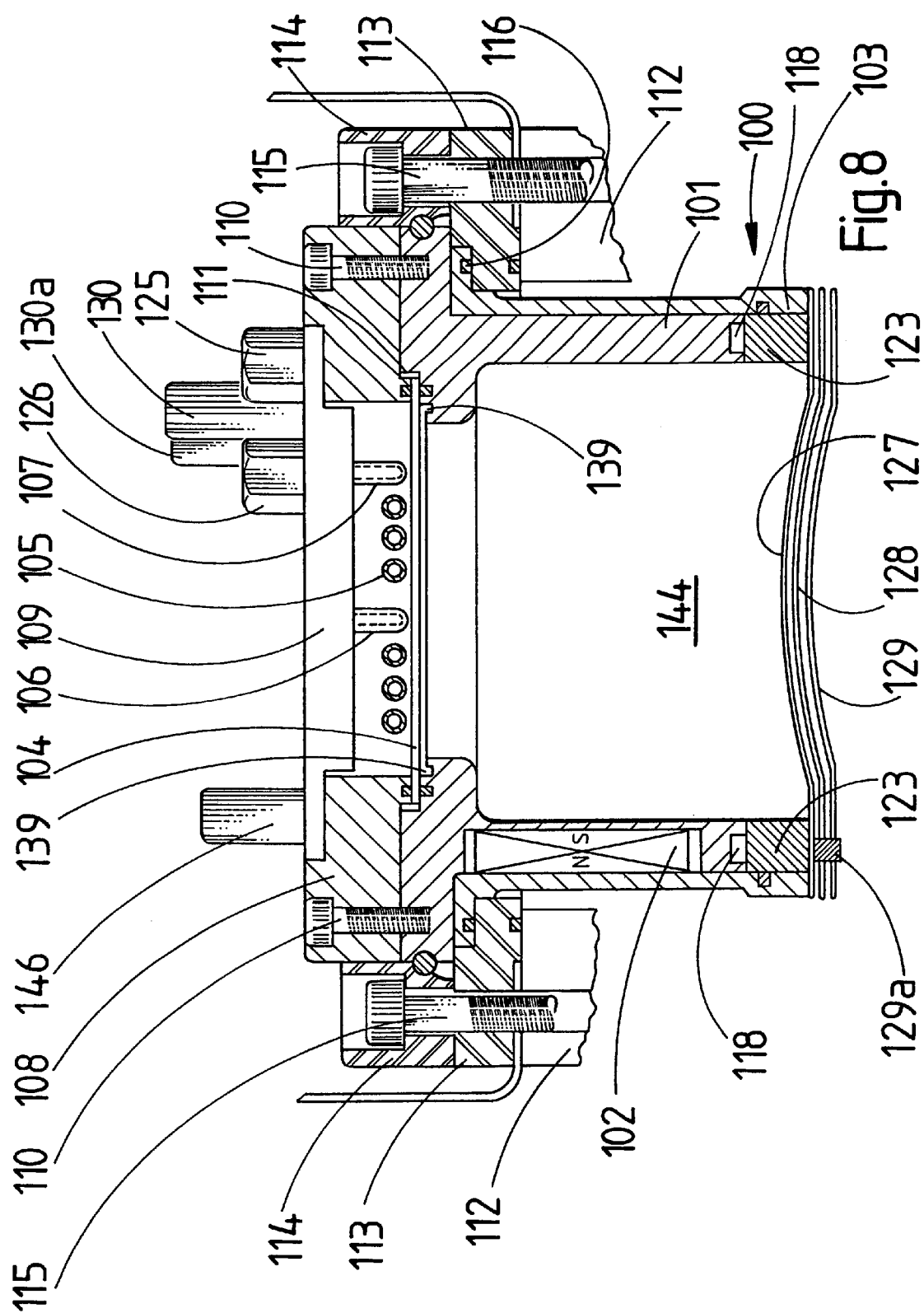
FIG. 8 is a vertical section through a second form of ion gun constructed according to the invention.

FIG. 8 is a vertical section through another form of ion gun 100 constructed in accordance with the invention. This comprises a body 101 made of austenitic stainless steel around which are mounted twenty bar magnets 102, symmetrically disposed about the periphery of ion gun 100. (There are few magnets in this embodiment than in that of FIGS. 1 to 7 because the diameter of body 101 is smaller than that of the ion gun of FIGS. 1 to 7). Typically the magnets 102 are rare earth magnets, such as samarium-cobalt magnets, with a field strength in the range of from about 0,1 T to about 0,2 T (1 kilogauss to about 2 kilogauss). As can be seen from FIG. 8, the magnetic axis of each magnet 102 is aligned so as to lie radially with respect to the axis of the ion gun 100 and to correspond to the shortest dimension of the magnet 102. The magnets 102 are arranged with alternating polarity around the periphery of ion gun 100 so that the magnets adjacent to the magnet shown in FIG. 8 have their north poles (not their south poles) facing towards the axis of ion gun 100, the next adjacent magnets to these have their south poles facing the axis of ion gun 100, and so on. A pole piece 103 made of soft iron or of a soft magnetic material surrounds body 101 and magnets 102.

Body 101 has an open upper end which is closed by dielectric end plate 104 made of alumina. Alternatively it can be made of another dielectric material such as silica.

Above end plate 104 is an r.f. generator coil 105 in the form of a spirally wound copper tube having four complete turns. (For the sake of clarity the coils of r.f. generator coil are omitted in FIG. 9; however, the construction of coil 105 is shown in more detail in FIGS. 17 to 19 as described (further below). Water can be pumped through coil 105 to cool it. The end portions of coil 105 are indicated by means of reference numerals 106 and 107.

A top ring 108 holds end plate 104 in position and further provides support for a clamp 109 for coil 105. Top ring 108 is held in place by means of socket headed bolts 110. An O-ring 111 serves to provide a seal between end plate 104 and top ring 108.

Ion gun 100 is mounted in a vacuum chamber, similar to vacuum chamber 2 of the apparatus of FIGS. 1 to 8, which is designated by reference numeral 112 and is generally similar to vacuum chamber 2. In particular it is provided with connections to a vacuum pump (not shown) and is fitted with an ion beam neutraliser (not shown) and with a target (also no shown). The gun 100 is mounted to the body of the vacuum chamber 112 by means of a spacer 113, a clamp 114, and bolts 115. An O-ring 116 serves to provide a vacuum seal between pole piece 103 and spacer 113.

FIGS. 12 to 15 show the construction of body 101 in more detail. This has twenty slots 117 formed in its outer surface, each adapted to receive a corresponding bar magnet 102. At the lower end of body 101 there are machined a number of short grooves 118, five in all, which are evenly spaced around the periphery of body 101. There are also four grooves 119 at the upper end of body 101 but these are offset with respect to grooves 118. Vertical bores 120 connect grooves 118 and 119. Bores 121 and 122 provide an inlet and outlet passage to the tortuous path provided by grooves 118 and 119 and bores 120. As can be seen from FIG. 8 grooves 118 are closed by means of split ring 123 which is welded on the lower end of body 101, whilst insert plates 124 (shown in FIG. 13) are welded into the upper end of body 101 to close off grooves 119. In this way a closed passage for a coolant, such as water, is formed through body 101 which follows a tortuous path passing between adjacent pairs of magnets 102. Inlet and outlet connections 125 and 126 are provided to communicate with bores 121 and 122.

Figure 10:
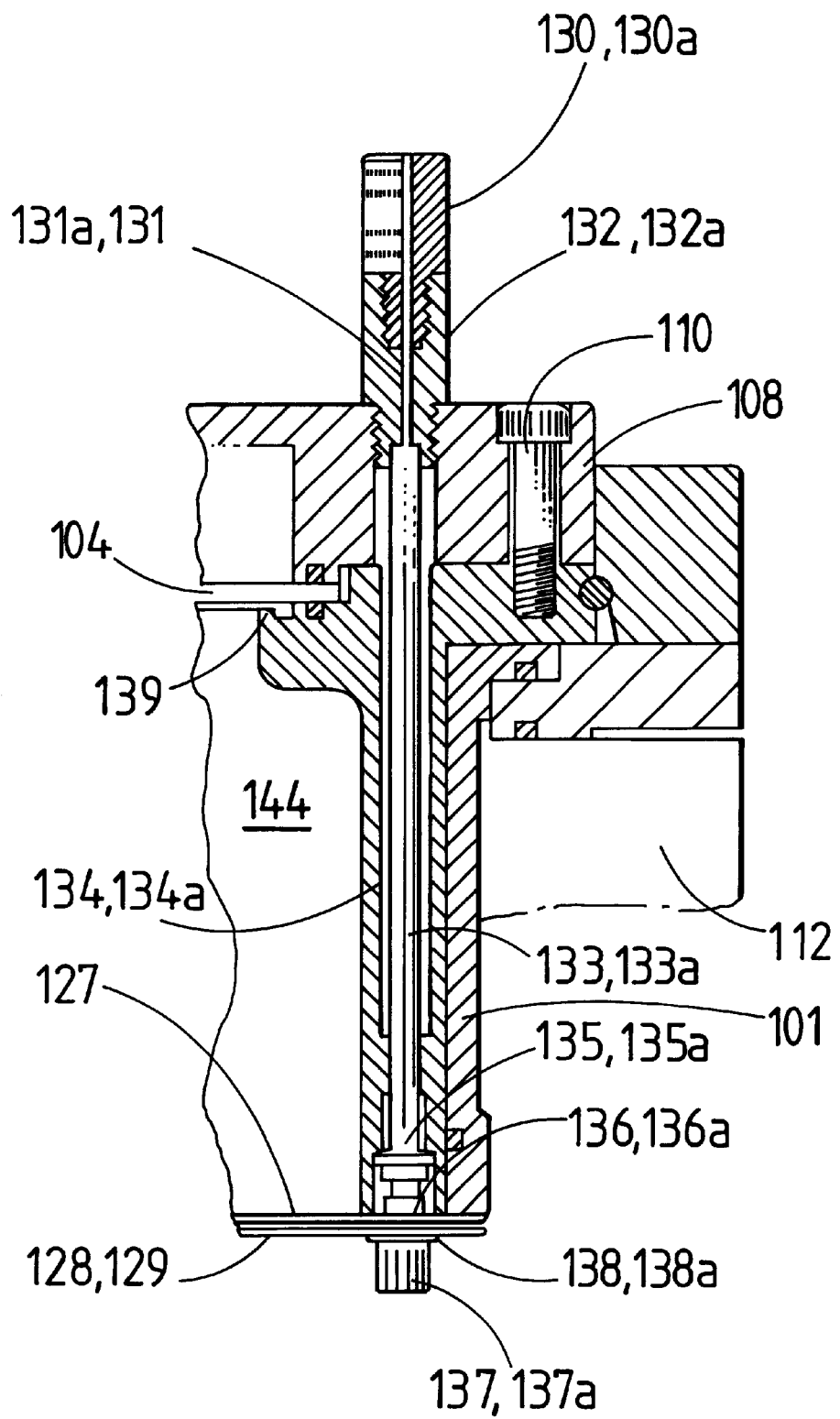
FIGS. 10 and 11 are sections on the lines A—A and B—B respectively of FIG. 9.
Figure 11:
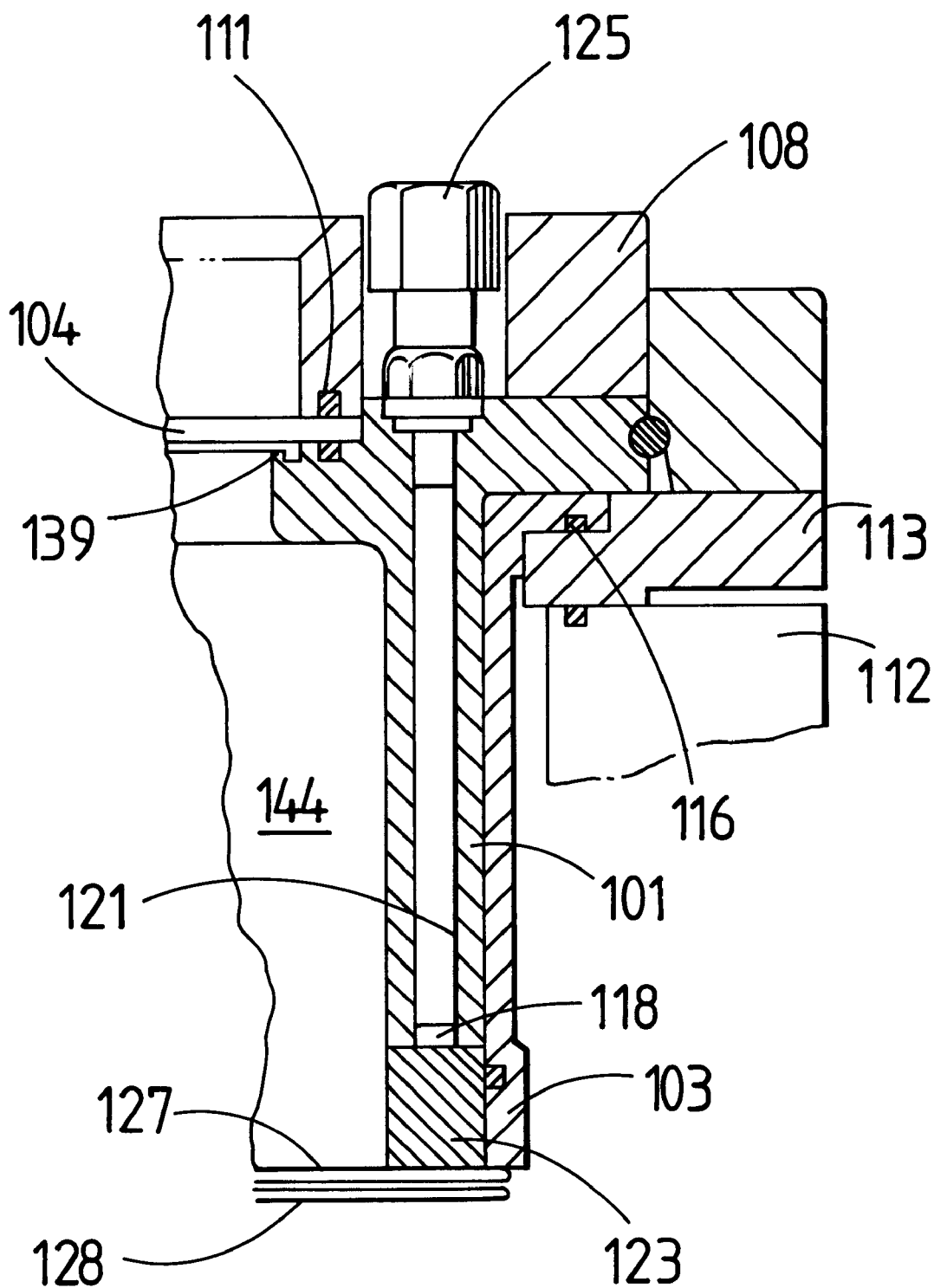
Figure 12:
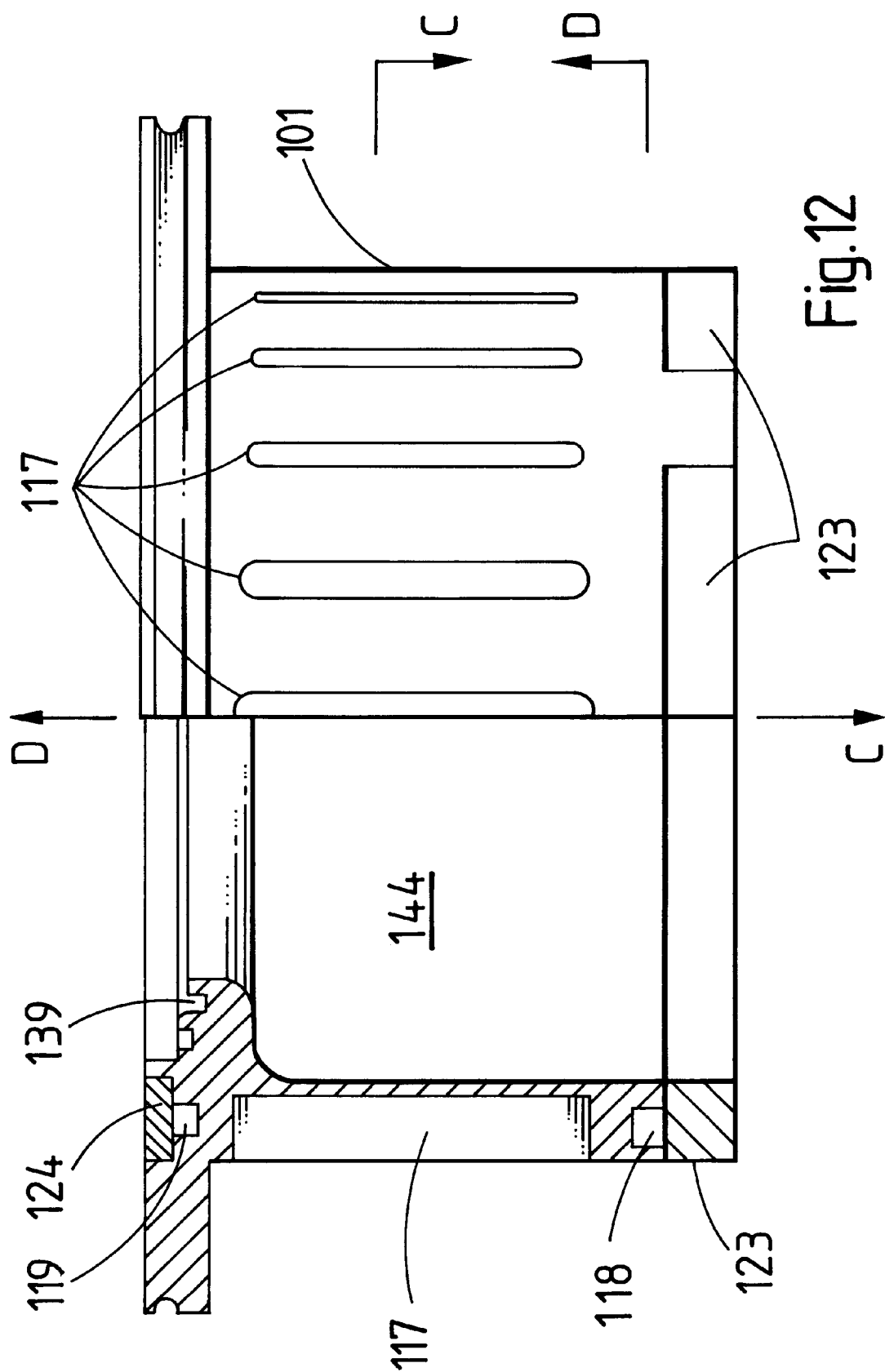
FIGS. 12 and 13 are a partly cut away side view and a top plan view respectively of the body of the ion gun of FIG. 8.
Figure 13:
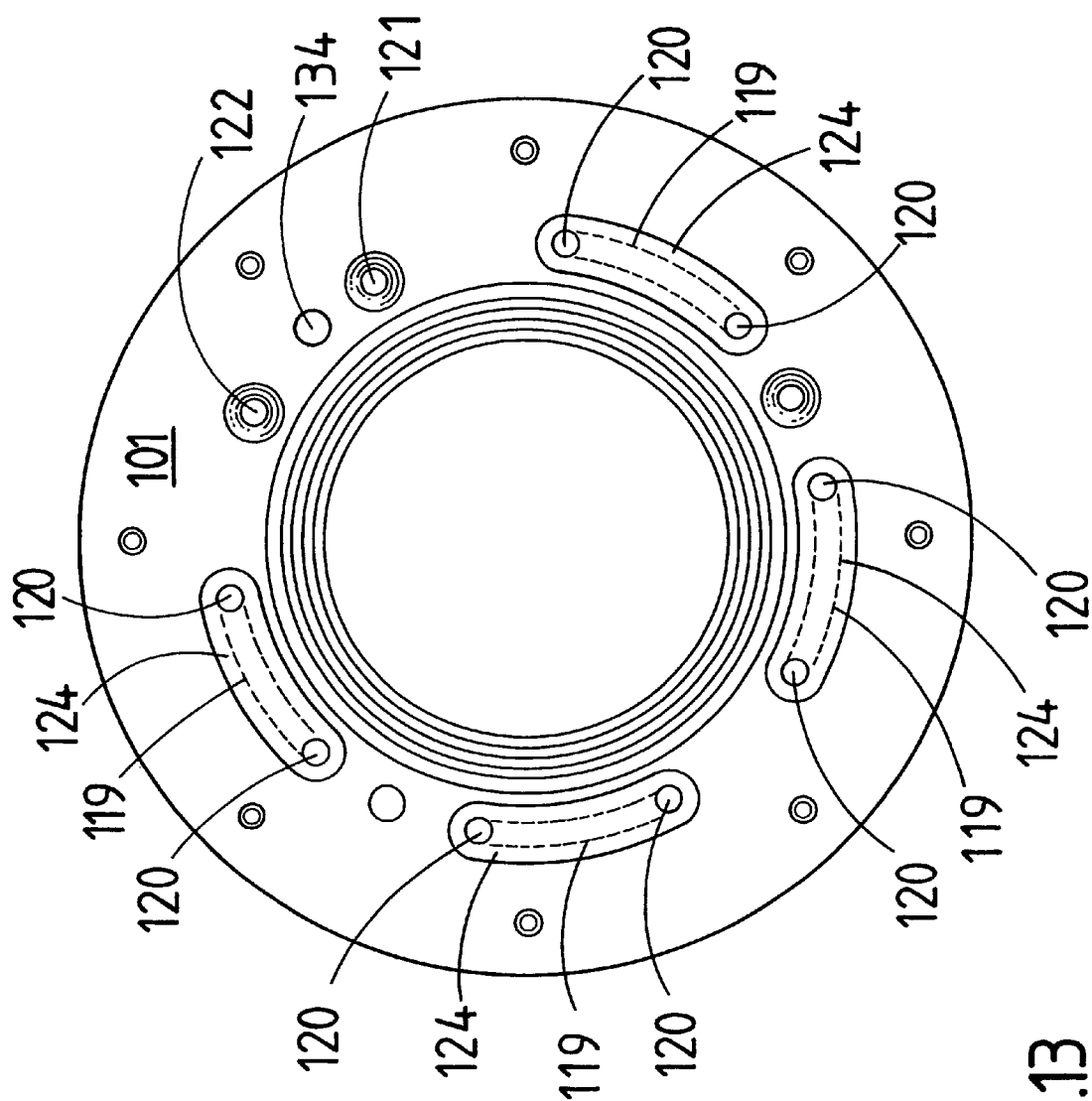
Figure 14:
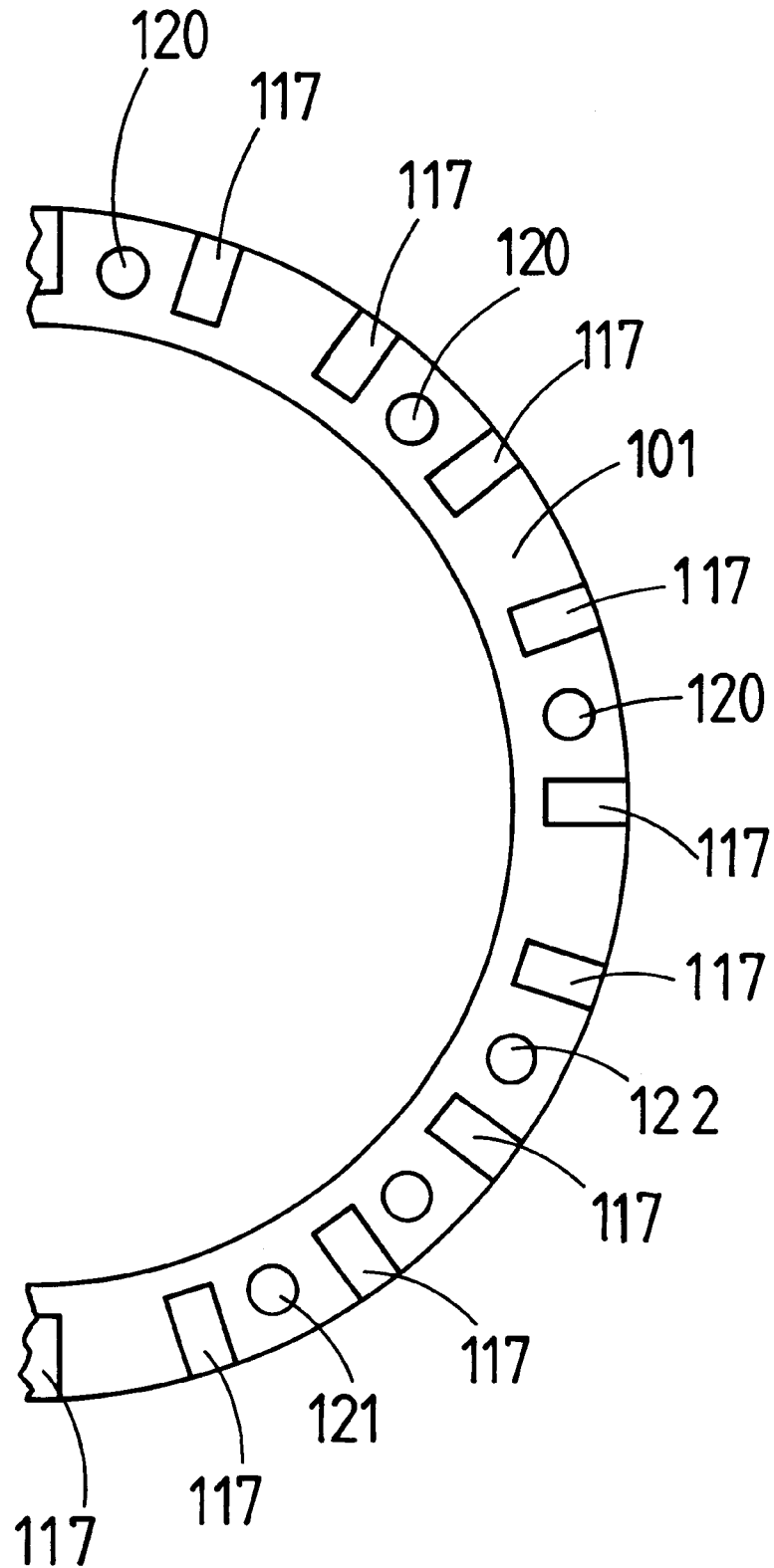
FIGS. 14 and 15 are sections on the lines C—C and D—D respectively of FIG. 12.
Figure 15:
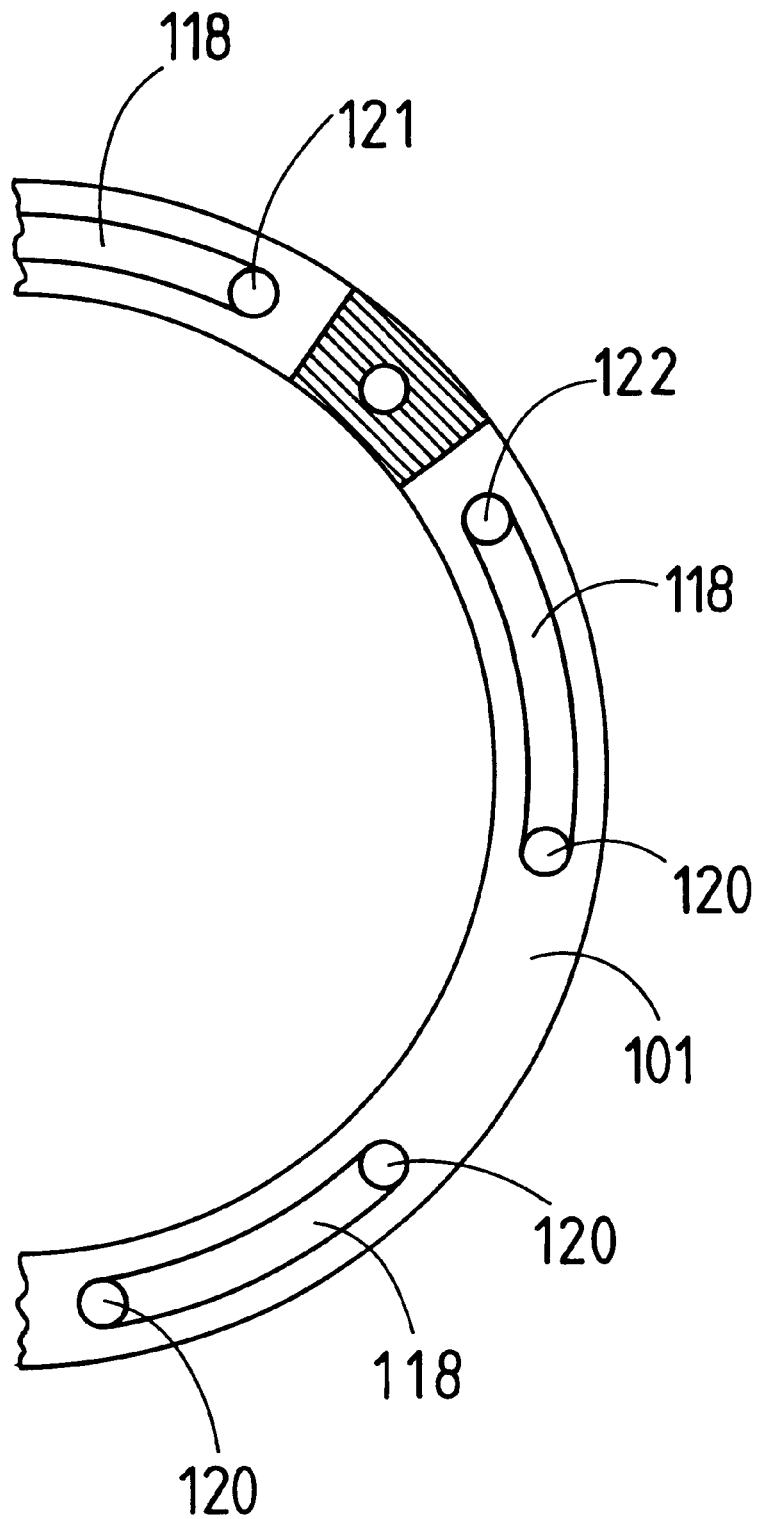

Body 101 carries at its lower end a control grid structure which includes a first grid 127, a second grid 128 and a third grid 129. Grid 127 is bolted directly to body 101 and is in electrical contact therewith. Grids 128 and 129 are supported at three points around the periphery of body 101 by suitable insulator supports 129a (only one of which is shown). As is shown in FIG. 10, they are connected to terminals 130 and 130a by respective leads 131 and 131a which pass through respective insulating pillars 132 and 132a and then through respective insulating tubes 133 and 133a mounted in bores 134 and 134a and which are electrically connected to respective grids 128 and 129 by means of a respective feedthrough 135 or 135a which passes through a respective spacer 136 or 136a positioned in a hole or holes in grid 127. Nut 137 or 137a and washer 138 or 138a complete the connection to respective grids 128 and 129. With this arrangement grid 127 adopts the potential of body 101, whilst grids 128 and 129 can be independently biased by applying a suitable potential to respective terminal 130 or 130a.

Figure 16:
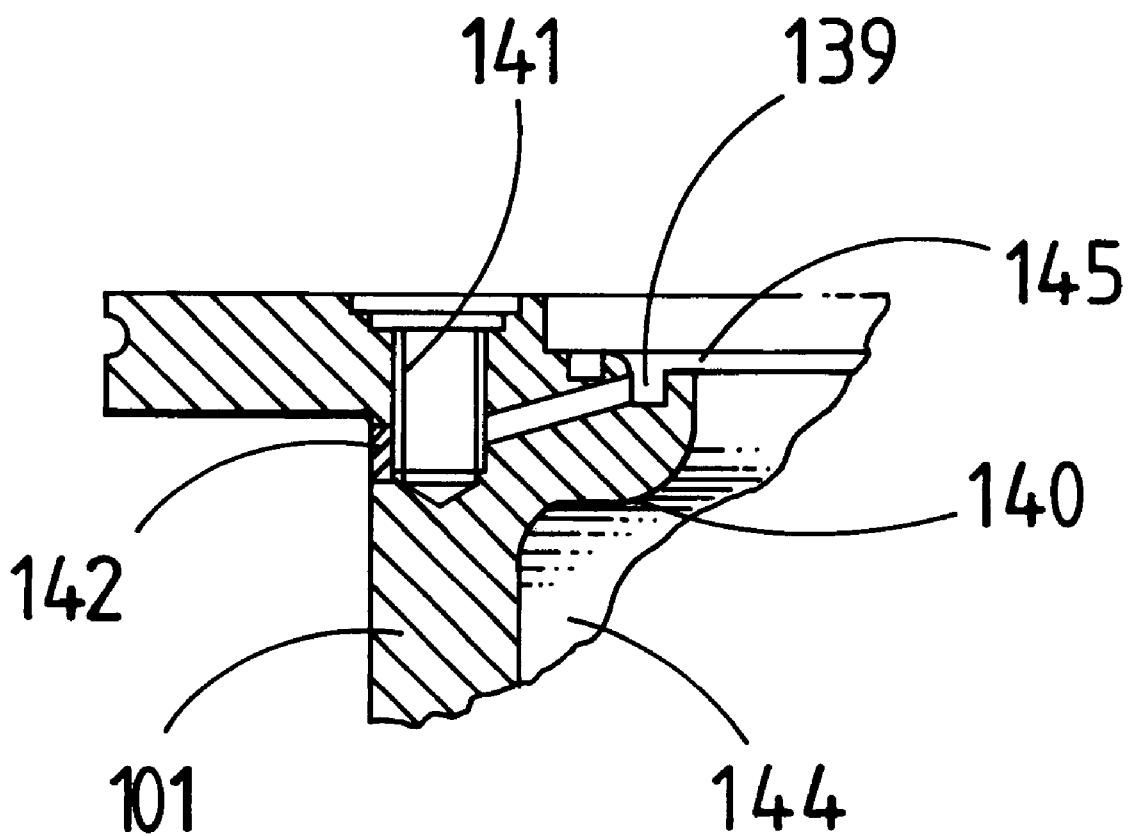
FIG. 16 is an enlarged section of part of the body of the ion gun of FIG. 8.

As can be seen from FIGS. 8, 10, 11 and 12 body 101 has a groove 139 positioned under the edge of dielectric member 104. This communicates by means of a transverse oblique bore 140 (see FIG. 16) with a further bore 141. Reference numeral 142 denotes a plug closing the outer end of bore 140. A connection 143 for a plasma gas supply (shown in FIG. 9) is screwed into bore 140. Such plasma gas can enter the plasma chamber 144 within body 101 by leakage from groove 139 through a clearance gap 145 (which is more clearly seen in FIG. 16) under dielectric member 104.

Figure 9:
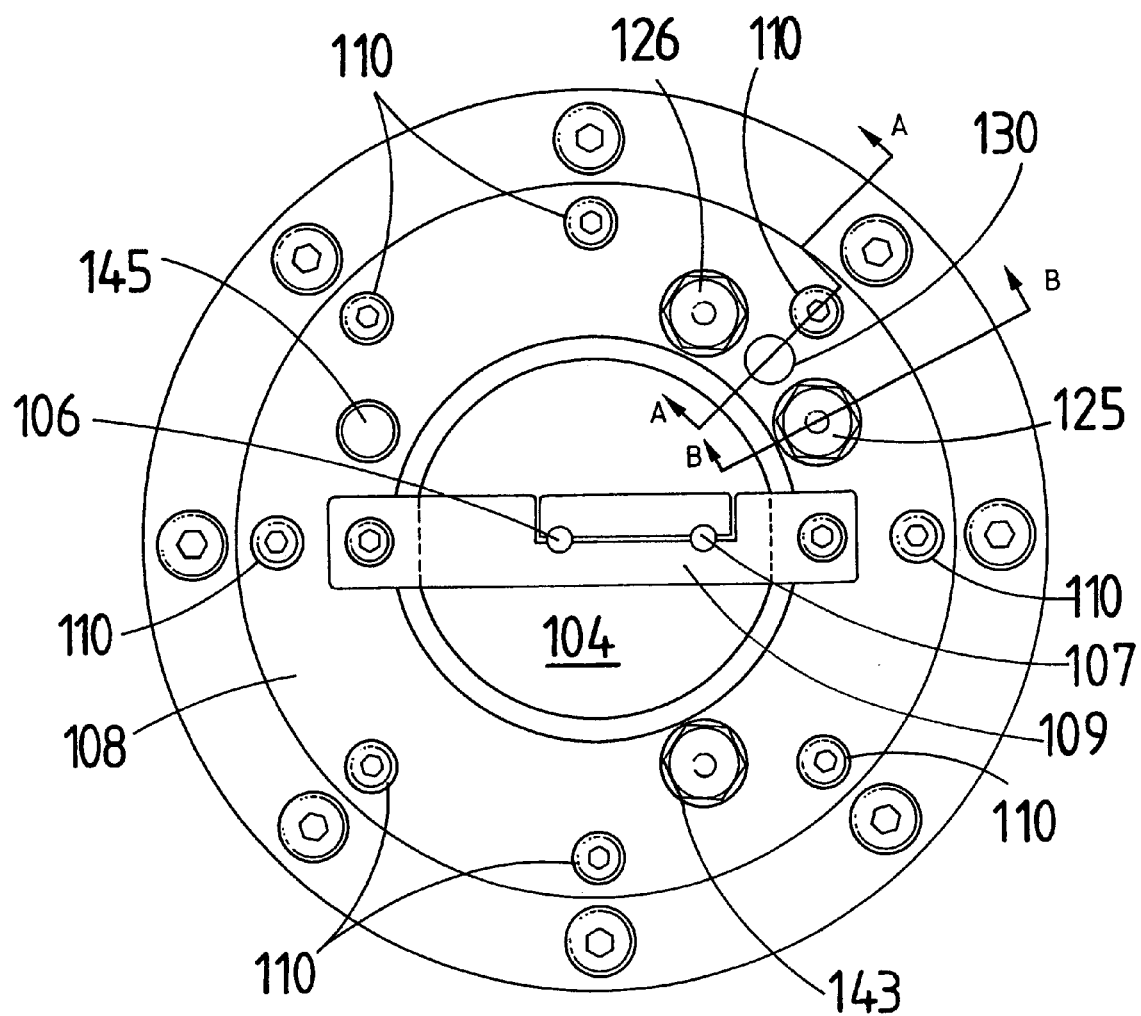
FIG. 9 is a top plan view of the ion gun of FIG. 8.

Reference numeral 146 in FIGS. 8 and 9 denotes a terminal by means of which a suitable potential, usually a positive potential, can be applied to body 101 and hence to grid 127.

Figure 17:
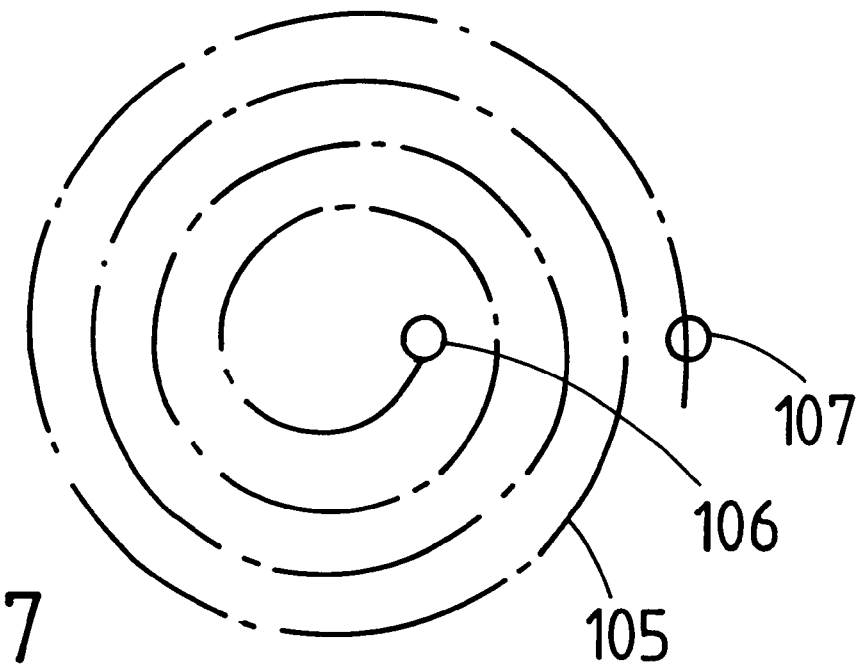
FIG. 17 is a schematic diagram of the axis of the tube from which the r.f. emitter coil is formed.
Figure 18:
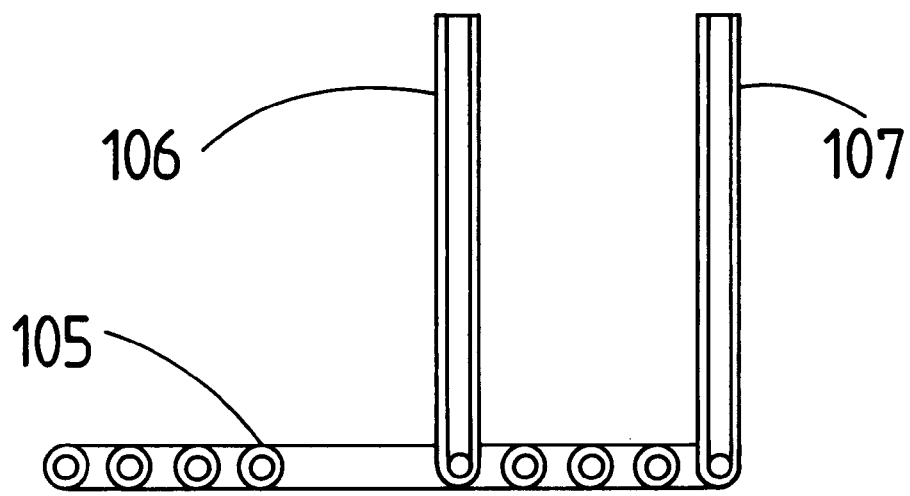
FIGS. 18 and 19 are respectively a section and a side view of the r.f. emitter coil.
Figure 19:
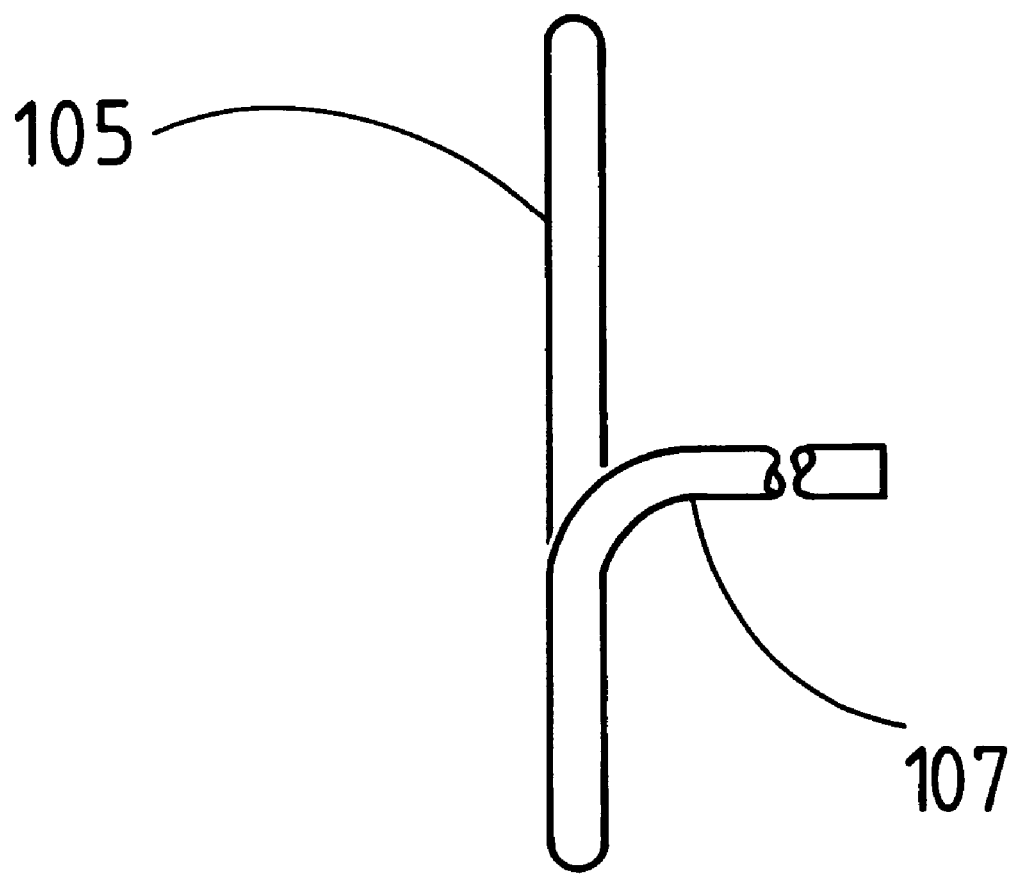

FIGS. 17 and 19 illustrate the construction of spiral r.f. coil 105 in greater details. Only the axis of the tube of coil 105 is depicted in FIG. 17. The coil has 4 complete turns between portions 106 and 107.

In use of the ion gun of FIGS. 8 to 19 water is passed through coil 105 and through the tortuous path in body 101 by means of inlet 125 and outlet 126 and vacuum chamber 112 is evacuated to a suitably low pressure, e.g. $10^{-3}$ Pa to $10^{-5}$ Pa ($10^{-1}$ millibar to $10^{-7}$ millibar). Body 101 is biased to a suitable potential, e.g. +900 V, whilst grid 128 is biased to, for example +725V, and grid 129 to −100 V. Plasma forming gas, such as argon or a mixture of argon and a reactive gas (e.g. oxygen), is then bled into vacuum chamber 112 via inlet 43 whilst maintaining a pressure in the range of from about $10^{-1}$ Pa to about $10^{-2}$ Pa (from about $10^{-3}$ millibar to about $10^{-4}$ millibar). Upon application of a suitable r.f. frequency, e.g. 13.56 MHz, to coil 105, a plasma is generated in plasma chamber 144. This typically equilibrates at a plasma potential of about 10 volts above that of body 101 and grid 127. Ions migrate by thermal diffusion, it is thought, to the vicinity of grid 127 and, upon passing through grid 127 are accelerated gently towards and through grid 128 by the electrical field caused by the potential difference between the two grids 127 and 128 (e.g. about 175 volts). After passage through grid 128 the ions are more rapidly accelerated (through a potential difference of about 825 volts) towards and through grid 129. After passing through grid 129 the ions travel on in vacuum chamber 112 towards a target (similar to target 9 of FIG. 1, but not shown) which is typically earthed. An ion beam neutraliser (not shown) similar to neutraliser 7 of FIG. 1 may be located within vacuum chamber 112. Grid 129 acts further to produce a deceleration field through which ions that have traversed grid 129 have to pass before hitting the target. In this way an ion beam with a suitable beam potential, which is normally approximately the same potential as that of the body 101 in the arrangement described, is produced.

Figure 20:
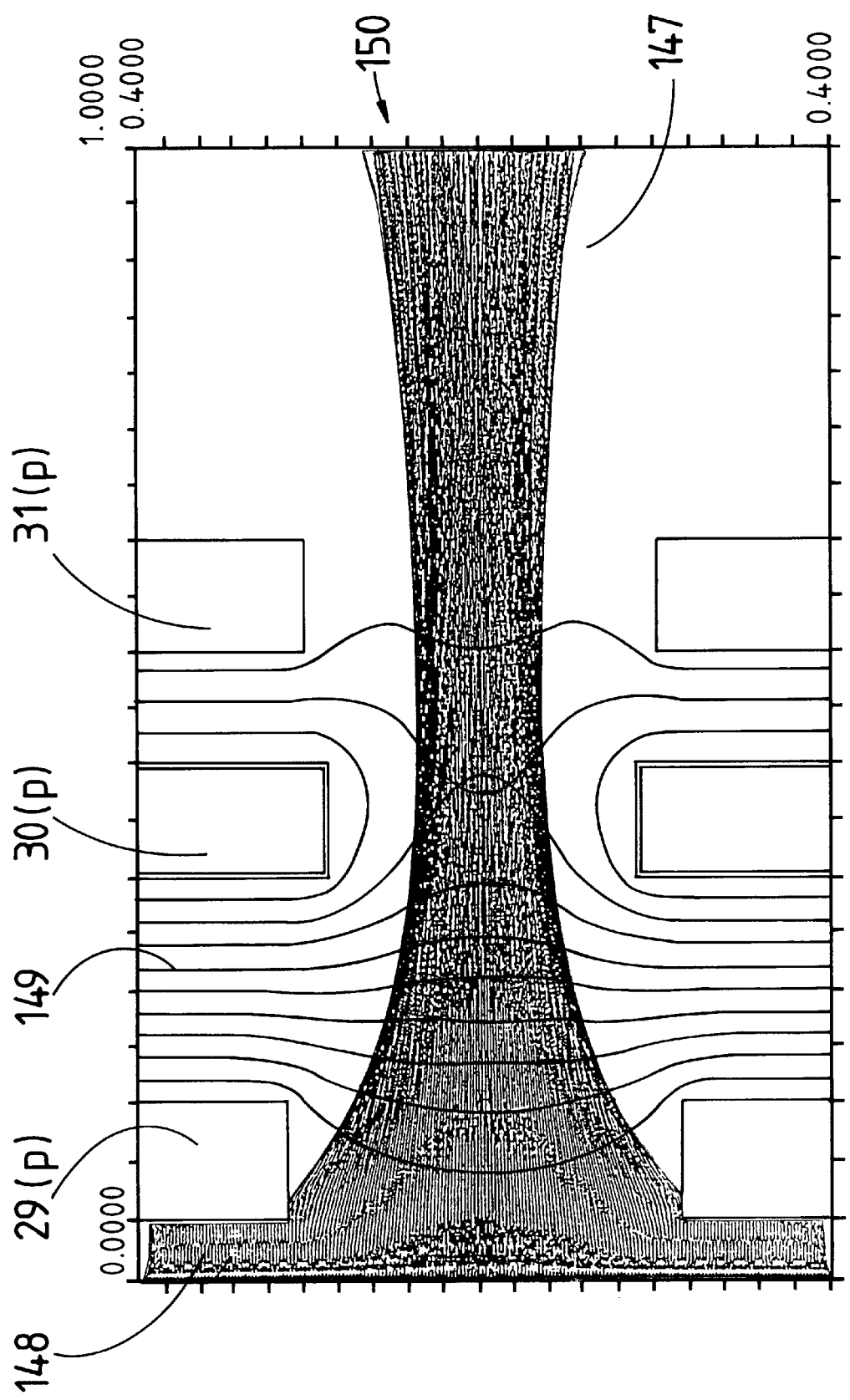
FIG. 20 shows, for comparative purposes, a representation of ion beam divergence in a prior art ion gun having a conventional three grid electrode structure.

Referring to FIG. 20, there can be seen the effect on ion beam divergence of a prior art three grid system in accordance with EP-B-0462165. The ion beam indicated by reference numeral 147 is accelerated from the plasma mass 148 towards grid 29(p) which is held at a positive potential of around 500 V. Rapid acceleration then occurs through the electric field indicated by field lines 149 which focus the ion beam into a divergent beam through grid 30(p) which is held at a potential of around −500 V. Grid 31(p) is connected to earth. The colossal acceleration of the ion beam through the 1000 V potential difference between grids 29(p) and 30(p) gives rise to a very strong space charge repulsive force in the region of grid 30(p). This repulsive force causes the strong divergence, seen at 150, of around 79.3 mrad (i.e. about 4°).

Figure 21:
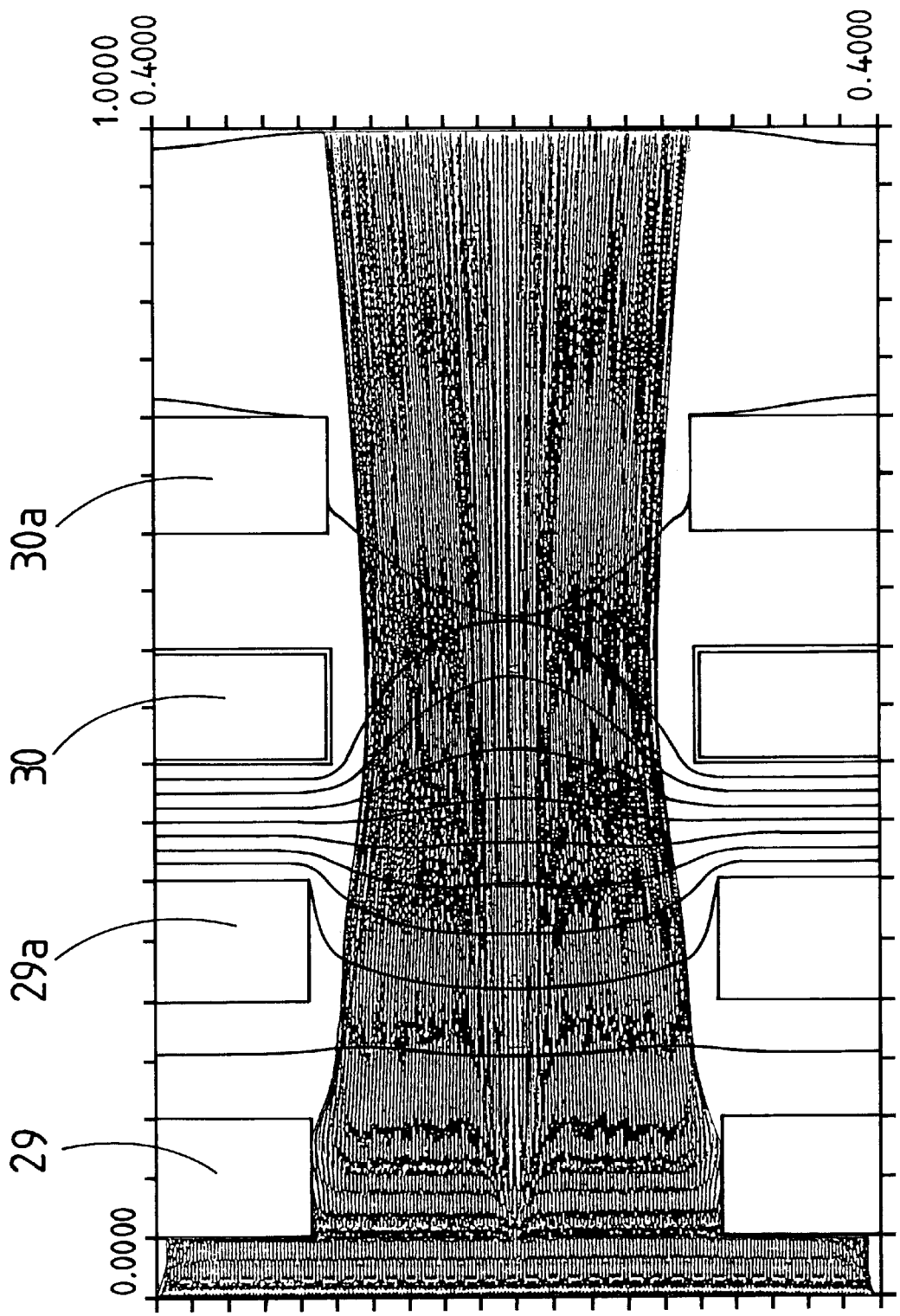
FIG. 21 shows a representation of ion beam divergence, directly comparable to the representation shown in FIG. 20, in a four grid electrode ion gun according to the invention.
Figure 23:
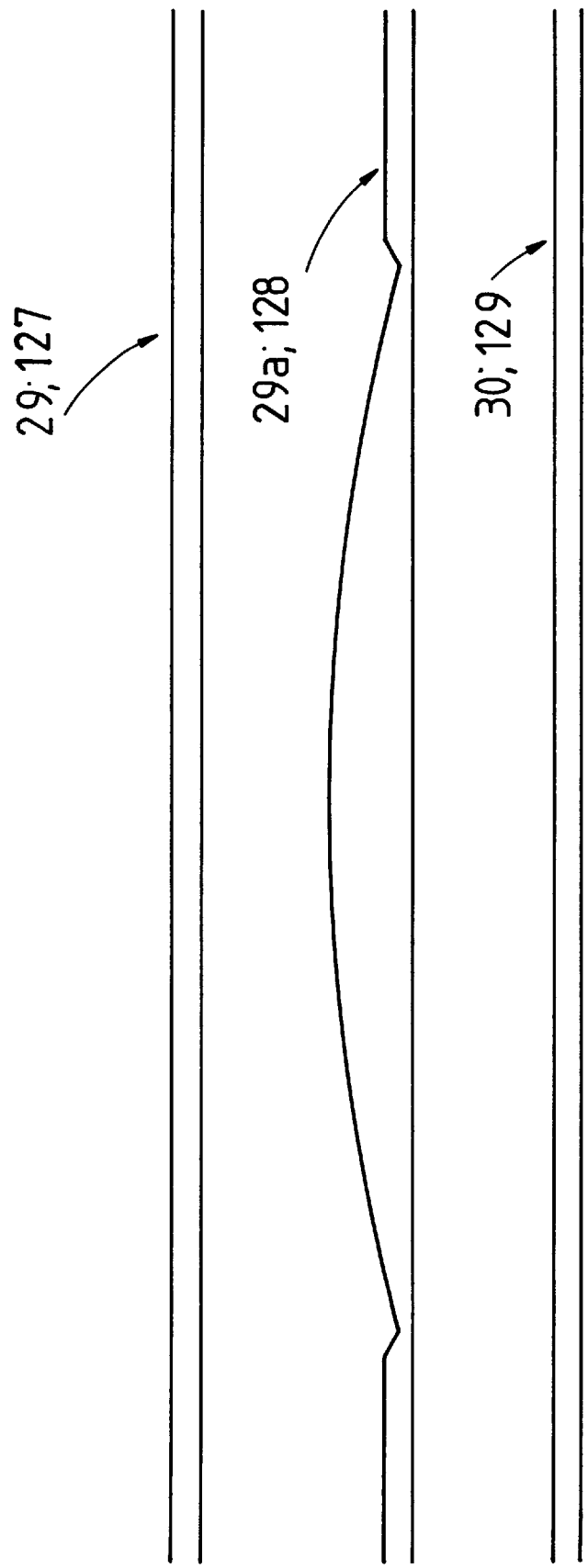
FIG. 23 is a vertical section through a third form of ion gun constructed according to the invention, showing an electrode grid arrangement in which the second grid is shaped.

In contrast, FIG. 21 shows the effect of the electrode grid arrangement according to the invention. First grid 29 is held at a positive potential of 900 V whilst second grid 29a is held at a lower positive potential of 725 V. Second grid 29a is contoured as shown in FIG. 23 so that the grid spacing between the first and second grids is greater towards the periphery of the grids than it is towards the centre thereof. The ion acceleration between grids 29 and 29a is gentler (a potential difference of just 175 V) than in the prior art grid of FIG. 20. This allows formation of a more stably collimated beam which is less susceptible to space charge repulsive forces in the region of third grid 30 and hence shows a divergence of just 15.7 mrad (less than 1°). In the embodiment shown in FIG. 21, four electrode grids are used. Third grid 30 is held at a negative potential of −100 V whilst fourth grid 30a is connected to earth.

Figure 22:
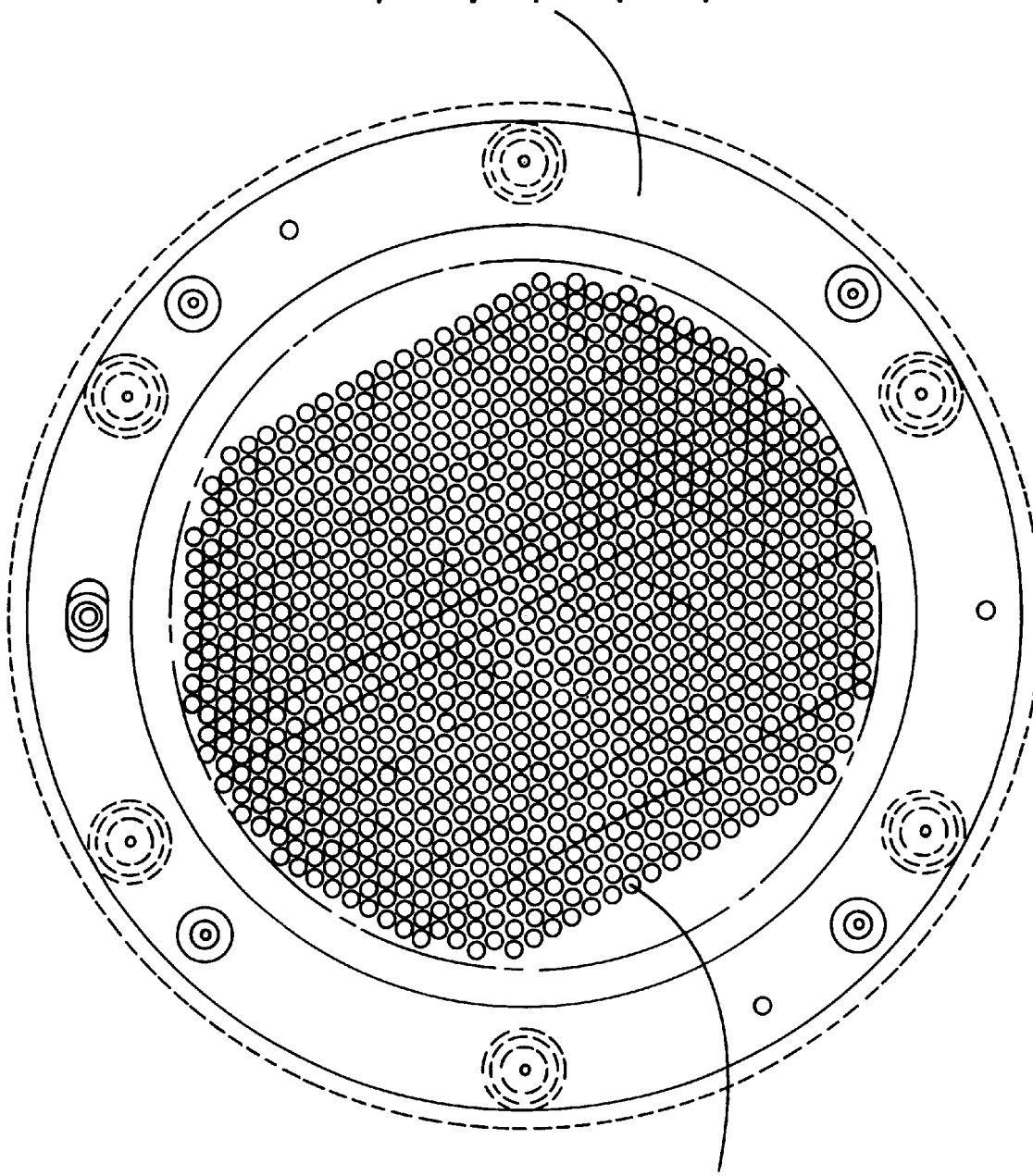
FIG. 22 is a top plan view of an electrode grid for use in the ion gun of the invention.

FIG. 22 shows a suitable grid in which holes 31, 31a, or 32 can be seen.

FIG. 23 shows more clearly the preferred form of grid arrangement according to the invention, in which the second grid 29a; 128 is contoured. The ion beams passing through individual holes will repel each other to a certain extent. If the middle grid is arcuate in section it will tend to focus the ion beams to a point but then the repulsion will tend to make them straight and parallel to each other.

It will be appreciated by those skilled in the art that the illustrated ion guns can be used in inert gas ion beam etching; in reactive ion beam etching, or in chemically assisted ion beam etching by suitable choice of the gas or gases supplied to the plasma chamber and to the ion beam neutraliser.

What is claimed is:

1. Apparatus for the production of low energy charged article beams comprising: a plasma chamber; means for generating in the plasma chamber a plasma comprising particles of a first polarity and oppositely charged particles of a second polarity; means for restraining particles of the first polarity in the plasma chamber; a first multi-aperture electrode grid contacting the plasma, wherein the first electrode grid is arranged for connection to a first potential source so as to impart to the first electrode grid a first potential of the second polarity; a second multi-aperture electrode grid arranged for connection to a second potential source so as to impart to the second electrode grid a second potential, the second potential being less than the first potential so as to produce between the first and second electrode grids a first acceleration field for accelerating charged particles of the second polarity towards and through the second grid; and a third multiaperture electrode grid arranged for connection to a third potential source so as to impart to the third electrode grid a third potential of the first polarity and to produce between the second and third electrode grids a second acceleration field for accelerating charged particles of the second polarity towards and through the third electrode grid, the grid spacing between the first and second grids being greater at the periphery of the grids than at the centre thereof, the apertures of the first, second and third grids being aligned so that particles emerging from an aperture of the first grid are accelerated through a corresponding aperture of the second grid and then through a corresponding aperture of the third grid in the form of a beamlet, a plurality of beamlets from the third grid forming a beam downstream of the third grid.

2. Apparatus according to claim 1, wherein the charged particles of the first polarity are ions and the charged particles of the second polarity are electrons.

3. Apparatus according to claim 1, wherein the charged particles of the first polarity are electrons and the charged particles of the second polarity are ions.

4. A low energy ion gun for use in ion beam processing comprising: a plasma chamber comprising an open ended, conductive, non-magnetic body, a first end of which is closed by a flat or minimally dished dielectric member and with electrodes at a second end thereof opposite the first end; primary magnet means arranged around the body for trapping electrons adjacent the wall of the plasma chamber in use of the ion gun;

and an r.f. induction device including a substantially flat coil which lies adjacent to the dielectric member for inductively generating a plasma in the plasma chamber, said electrodes including a first multi-aperture grid arranged for connection to a first positive potential source and positioned to contact the plasma in the plasma chamber; a second multi-aperture grid arranged for connection to a second potential source of lower potential than the first source so as to produce a first acceleration field for accelerating ions towards and through the second grid; and a third multi-aperture grid arranged for connection to a third potential source of lower potential than the second potential source so as to produce a second acceleration field for accelerating ions towards and through the third grid, the grid spacing between the first and second grids being greater at the periphery of the grids than at the centre thereof, the apertures of the first, second and third grids being aligned so that particles emerging from an aperture of the first grid are accelerated through a corresponding aperture of the second grid and then through a corresponding aperture of the third grid in the form of a beamlet, a plurality of beamlets from the third grid forming a beam downstream of the third grid.

5. An ion gun according to claim 4, wherein the third potential source is arranged to impart a negative potential to the third grid.

6. An ion gun according to claim 4, wherein the third potential source is arranged to earth the third grid.

7. An ion gun according to claim 6, wherein a fourth grid is provided and is arranged for connection to earth.

8. A low energy ion gun for use in ion beam processing comprising: a plasma chamber comprising an open ended, conductive, non-magnetic body, a first end of which is closed by a flat or minimally dished dielectric member and with electrodes at a second end thereof opposite the first end; primary magnet means arranged around the body for trapping electrons adjacent the wall of the plasma chamber in use of the ion gun; and an r.f. induction device including a substantially flat coil which lies adjacent to the dielectric member for inductively generating a plasma in the plasma chamber, said electrodes including a first multi-aperture grid arranged for a connection to a first positive potential source and positioned to contact the plasma in the plasma chamber; a second multi-aperture grid arranged for connection to a second potential source of lower potential than the first source so as to produce a first acceleration field for accelerating ions towards and through the second grid; a third multi-aperture grid arranged for connection to a negative potential source so as to produce a second acceleration field for accelerating ions towards and through the third grid; and a fourth multi-aperture grid arranged for connection to earth, the apertures of the first, second, third and fourth grids being aligned so that ions emerging from an aperture of the first grid are accelerated through a corresponding aperture of the second grid and then through a corresponding aperture of the third grid before passing through a corresponding aperture of the fourth grid in the form of a beamlet, a plurality of beamlets from the fourth grid forming a beam downstream of the fourth grid.

9. An ion gun according to claim 8, wherein the potential difference between the second and third grids is greater than the potential difference between the first and second grids so that the first acceleration field is more gentle than the second acceleration field.

10. An ion gun according to claim 8, wherein the grid spacing between first and second grids is greater at the periphery of the grids than at the centre thereof.

11. An ion gun according to claim 10, wherein the grid spacing at the periphery of the grids is about 30% greater than the grid spacing at the centre of the grids.

12. An ion gun according to claim 10, wherein at least one of the first and second grids is contoured to provide a decreased grid spacing towards the central region of the grids relative to the peripheral region thereof.

13. An ion gun according to claim 8, wherein each grid comprises a regular array of apertures 2 mm to 6 mm in diameter.

14. An ion gun according to claim 13, wherein each of the apertures is about 4 mm in diameter.

15. An ion gun according to claim 8, wherein the grid spacing between adjacent apertures in the region of the centre of neighbouring grids is from about 0.5 mm to 3.0 mm.

16. An ion gun according to claim 15, wherein the grid spacing between adjacent apertures in the region of the centre of neighbouring grids is about 1 mm.

17. An ion gun according to claim 8, wherein the grids are made of a rigid material.

18. An ion gun according to claim 8, wherein the dielectric member is flat.

19. An ion gun according to claim 8, wherein the coil lies outside and adjacent to, or is embedded within, the dielectric member.

20. An ion gun according to claim 8, wherein the coil is arranged to operate at a frequency in the range of from about 1 MHz to about 40 MHz.

21. An ion gun according to claim 8, wherein said primary magnet means comprises an array of magnets arranged to produce lines of magnetic flux within the plasma chamber which extend in a curve from the wall of the plasma chamber and return thereto so as to form an arch over a respective one of a plurality of wall regions of said plasma chamber.

22. An ion gun according to claim 21, wherein said wall regions extend longitudinally of the wall of said plasma chamber from one end of the chamber to another.

23. An ion gun according to claim 8, wherein said primary magnet means comprises an even number of magnets arranged in an array including at least one row extending around the periphery of said plasma chamber, each magnet in said array being disposed with its magnetic axis extending substantially in a lateral plane and having a pole of opposite polarity to that of the magnets adjacent to it facing towards the plasma chamber.

24. An ion gun according to claim 23, wherein the array of magnets comprises a plurality of rows of magnets extending around the periphery of said plasma chamber with each magnet in a row having a pole of opposite polarity to that of any adjacent magnet in another adjacent row facing towards the plasma chamber.

25. An ion gun according to claim 8, further comprising secondary magnet means associated with the r.f. emitter coil for producing a magnetic dipole field that penetrates the r.f. emitter coil.

26. A method for generating a low energy ion beam comprising the steps of:
(a) providing an ion gun comprising: a plasma chamber having an open ended, conductive, non-magnetic body, a first end of which is closed by a flat or minimally dished dielectric member and with electrodes at a second end thereof opposite the first end; primary magnet means arranged around the body for trapping electrons adjacent the wall of the plasma chamber in use of the ion gun, and an r.f. induction device including a substantially flat coil which lies adjacent to the dielectric member for inductively generating a plasma in the plasma chamber, said electrodes including a first multi-aperture grid arranged for a connection to a first positive potential source and positioned to contact the plasma in the plasma chamber; a second multi-aperture grid arranged for connection to a second potential source of lower potential than the first source so as to produce a first acceleration field for accelerating ions towards and through the second grid; a third multi-aperture grid arranged for connection to a negative potential source so as to produce a second acceleration field for accelerating ions towards and through the third grid; and a fourth multi-aperture grid arranged for connection to earth, the apertures of the first, second, third, and fourth grids being aligned so that ions emerging from an aperture of the first grid are accelerated through a corresponding aperture of the second grid and then through a corresponding aperture of the third grid before passing through a corresponding aperture of the fourth grid in the form of a beamlet, a plurality of beamlets from the fourth grid forming a beam downstream of the fourth grid;

(b) supplying to the plasma chamber a plasma forming gas;

(c) exciting the r.f. induction device to generate a plasma within the plasma chamber;

(d) supplying the plasma to an inlet end of the first grid so that the plasma passes through the first grid towards an outlet end thereof;

(e) accelerating the plasma between the outlet end of the first grid and an inlet end of the second grid so that the plasma passes through the second grid towards an outlet end thereof;

(f) further accelerating the plasma between the outlet end of the second positive grid and an inlet end of the third grid so that the plasma passes through the third grid towards an outlet end thereof; and (g) recovering a plurality of ion beamlets from the outlet end of the third grid.

27. A low energy ion beam processing apparatus comprising:
(1) a vacuum chamber;
(2) an ion gun arranged to project an ion beam into the vacuum chamber;
(3) an ion beam neutraliser for projecting electrons into the ion beam; and
(4) a support for a target or a substrate in the path of the ion beam, wherein the ion gun comprises: a plasma chamber having an open ended, conductive, non-magnetic body, a first end of which is closed by a flat or minimally dished dielectric member and with electrodes at a second end thereof opposite the first end; primary magnet means arranged around the body for trapping electrons adjacent the wall of the plasma chamber in use of the ion gun; and an r.f. induction device including a substantially flat coil which lies adjacent to the dielectric member for inductively generating a plasma in the plasma chamber, said electrodes including a first multi-aperture grid arranged for a connection to a first positive potential source and positioned to contact the plasma in the plasma chamber; a second multi-aperture grid arranged for connection to a second potential source of lower potential than the first source so as to produce a first acceleration field for accelerating ions towards and through the second grid; a third multi-aperture grid arranged for connection to a negative potential source so as to produce a second acceleration field for accelerating ions towards and through the third grid; and a fourth multiaperture grid arranged for connection to earth, the apertures of the first, second, third, and fourth grids being aligned so that ions emerging from an aperture of the first grid are accelerated through a corresponding aperture of the second grid and then through a corresponding aperture of the third grid before passing through a corresponding aperture of the fourth grid in the form of a beamlet, a plurality of beamlets from the fourth grid forming a beam downstream of the fourth grid.

28. An ion beam processing apparatus according to claim 27, wherein the ion beam neutraliser is powered by an r.f. energy source.

29. An ion beam processing apparatus according to claim 27, wherein the ion bean neutraliser comprises an open ended plasma source chamber means for admitting a plasma forming gas to the plasma source chamber, an r.f. generating coil surrounding the plasma source chamber for inductively generating a plasma therein, and an extraction grid structure across the open end of the plasma source chamber including a first grid arranged for connection to a potential source, and a second grid arranged for connection to a positive potential source so as to produce an acceleration field for accelerating electrons towards and through the second grid of the extraction grid structure.

* * * * *